(12) United States Patent
Sakai

(10) Patent No.: US 12,225,719 B2
(45) Date of Patent: Feb. 11, 2025

(54) SEMICONDUCTOR STORAGE DEVICE

(71) Applicant: Socionext Inc., Kanagawa (JP)

(72) Inventor: Yasumitsu Sakai, Kanagawa (JP)

(73) Assignee: SOCIONEXT INC., Kanagawa (JP)

( * ) Notice: Subject to any disclaimer, the term of this patent is extended or adjusted under 35 U.S.C. 154(b) by 500 days.

(21) Appl. No.: 17/524,369

(22) Filed: Nov. 11, 2021

(65) Prior Publication Data

US 2022/0068942 A1 Mar. 3, 2022

Related U.S. Application Data

(63) Continuation of application No. PCT/JP2020/018393, filed on May 1, 2020.

(30) Foreign Application Priority Data

May 13, 2019 (JP) .................................. 2019-090699

(51) Int. Cl.
| | | |
|---|---|---|
| *H10B 20/00* | (2023.01) | |
| *H01L 29/06* | (2006.01) | |
| *H01L 29/423* | (2006.01) | |
| *H01L 29/775* | (2006.01) | |
| *H01L 29/786* | (2006.01) | |

(52) U.S. Cl.
CPC ......... *H10B 20/50* (2023.02); *H01L 29/0673* (2013.01); *H01L 29/42392* (2013.01); *H01L 29/775* (2013.01); *H01L 29/78696* (2013.01); *H10B 20/34* (2023.02)

(58) Field of Classification Search
CPC ..... H10B 20/50; H10B 20/34; H01L 29/0673; H01L 21/8221
See application file for complete search history.

(56) References Cited

U.S. PATENT DOCUMENTS 5,917,224 A * 6/1999 Zangara ................. H10B 20/00
 257/E27.102
7,715,246 B1 5/2010 Kim
2011/0303972 A1 12/2011 Saitoh et al.
(Continued)

FOREIGN PATENT DOCUMENTS

JP 2011-258898 A 12/2011

OTHER PUBLICATIONS

J. Ryckaert et al., "The Complementary FET (CFET) for CMOS scaling beyond N3," 2018 IEEE Symposium on VLSI Technology Digest of Technical Papers, 2018, pp. 141-142.
(Continued)

*Primary Examiner* — Syed I Gheyas
*Assistant Examiner* — Casey Paul Boatman
(74) *Attorney, Agent, or Firm* — Rimon P.C.

(57) ABSTRACT

A ROM cell includes first and second three-dimensional transistors. The second transistor is formed above the first transistor, and the channel portions of the first and second transistors overlap each other. First data is stored depending on whether first and second local interconnects connected to the nodes of the first transistor are connected to a same line, or different lines, out of a bit line and a ground power supply line. Second data is stored depending on whether third and fourth local interconnects connected to the nodes of the second transistor are connected to a same line, or different lines, out of a bit line and a ground power supply line.

6 Claims, 16 Drawing Sheets

(56) References Cited

U.S. PATENT DOCUMENTS

| | | | |
|---|---|---|---|
| 2016/0329313 A1 | 11/2016 | Kawa et al. | |
| 2018/0026042 A1* | 1/2018 | Smith | H01L 27/0688 |
| | | | 257/390 |
| 2018/0151576 A1 | 5/2018 | Lee | |
| 2018/0366589 A1* | 12/2018 | Shimbo | H01L 27/092 |
| 2020/0035691 A1* | 1/2020 | Reznicek | H01L 29/105 |
| 2020/0219813 A1* | 7/2020 | Paul | H01L 21/30604 |

OTHER PUBLICATIONS

A. Mocuta, et al., "Enabling CMOS Scaling Towards 3nm and Beyond," 2018 IEEE Symposium on VLSI Technology Digest of Techincal Papers, 2018, pp. 147-148.

International Search Report issued in International Patent Application No. PCT/JP2020/018393, mailed Jun. 30, 2020; with English translation.

Written Opinion of the International Searching Authority issued in International Patent Application No. PCT/JP2020/018393, mailed Jun. 30, 2020; with partial English translation.

* cited by examiner

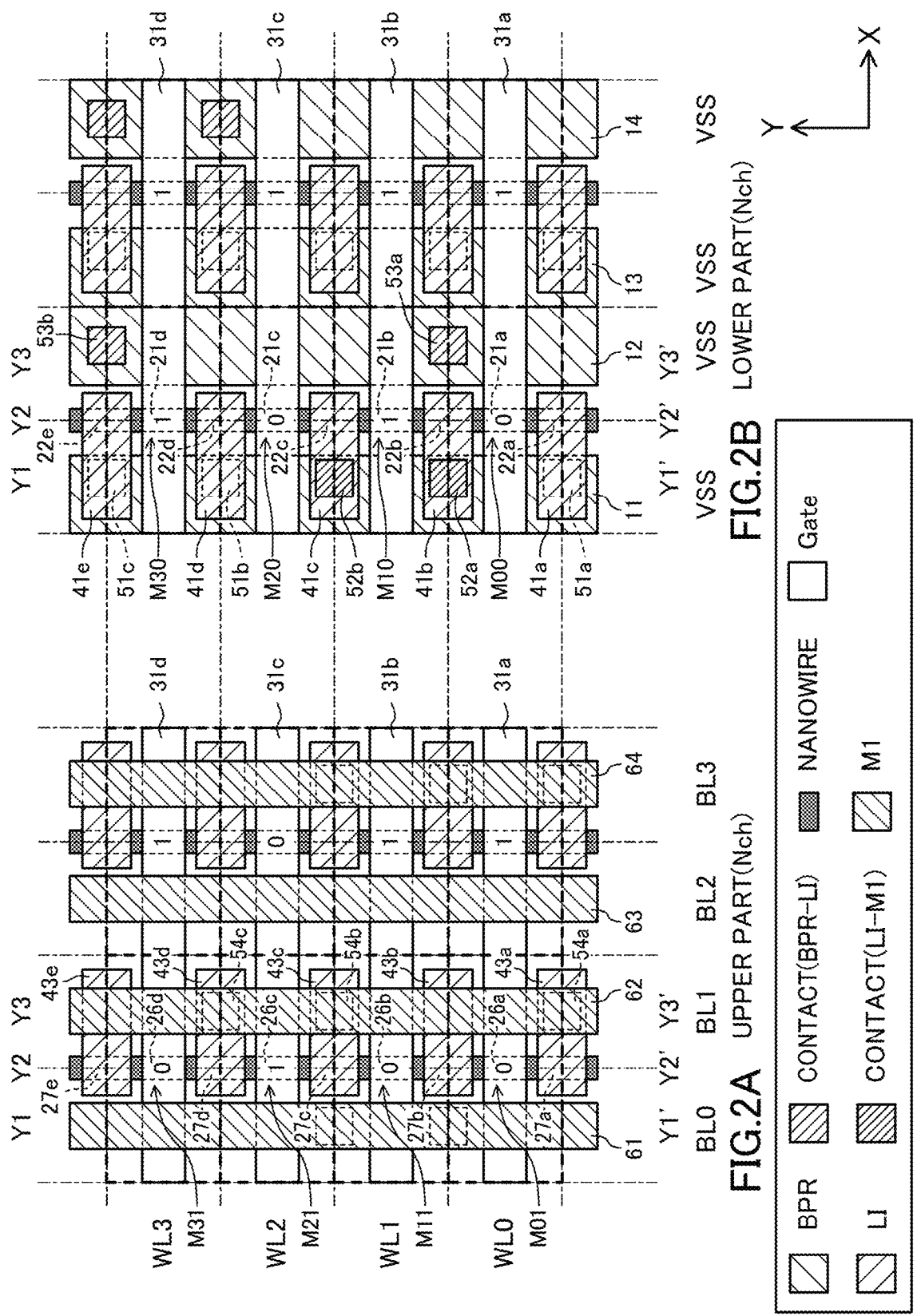

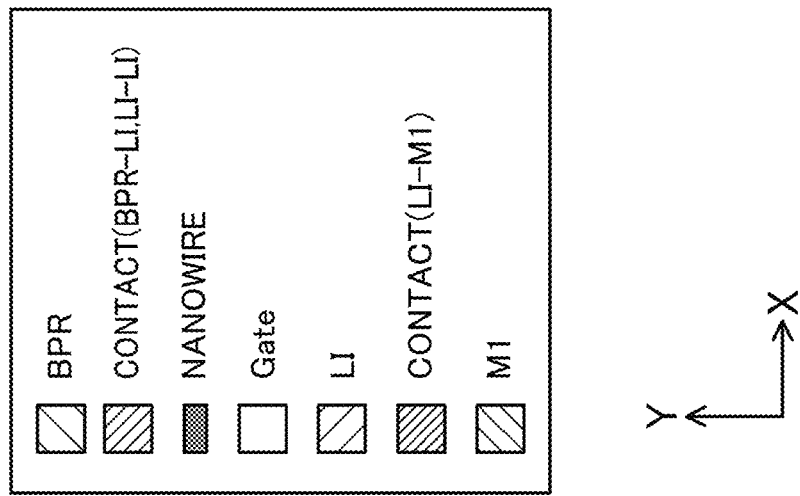
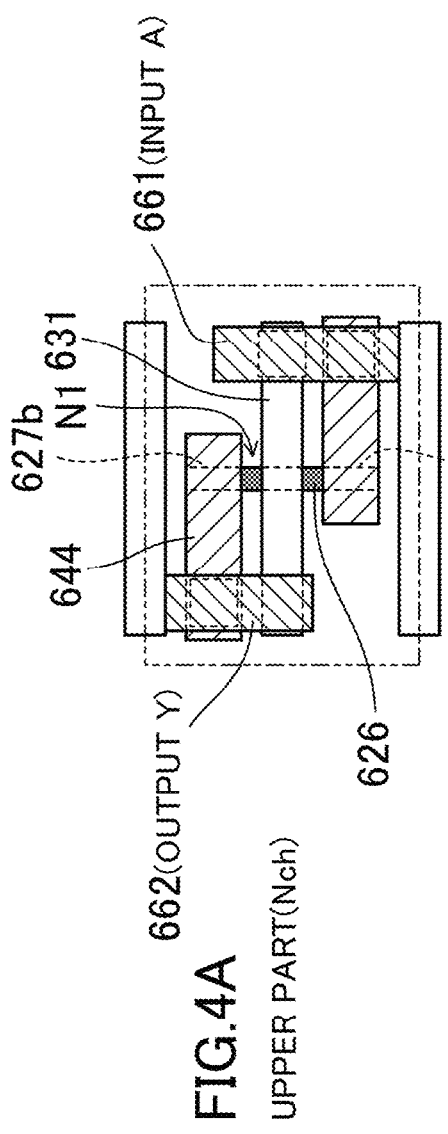
FIG.4A
UPPER PART(Nch)
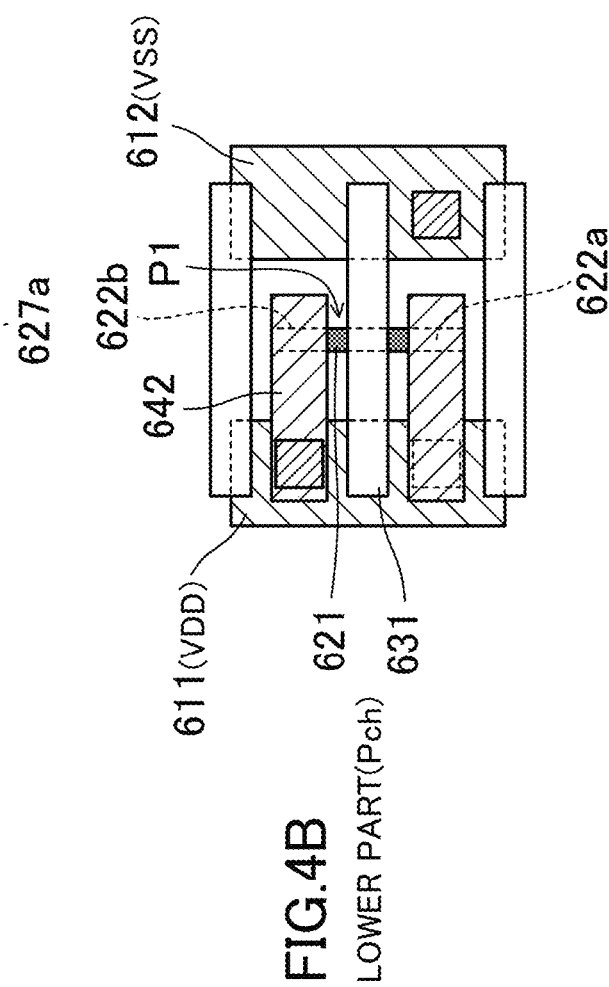
FIG.4B
LOWER PART(Pch)

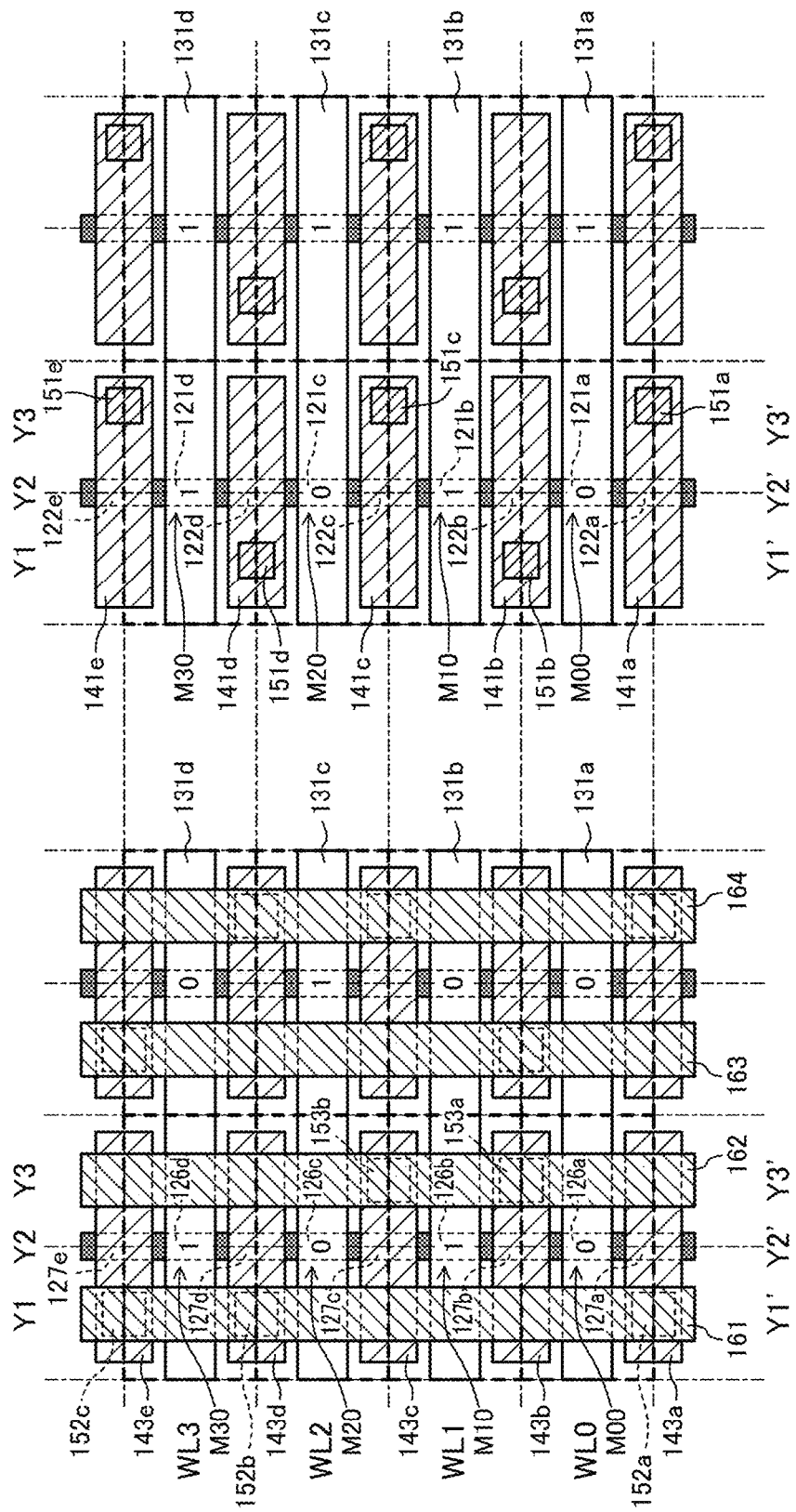
FIG.5A UPPER PART(Nch)
FIG.5B LOWER PART(Nch)

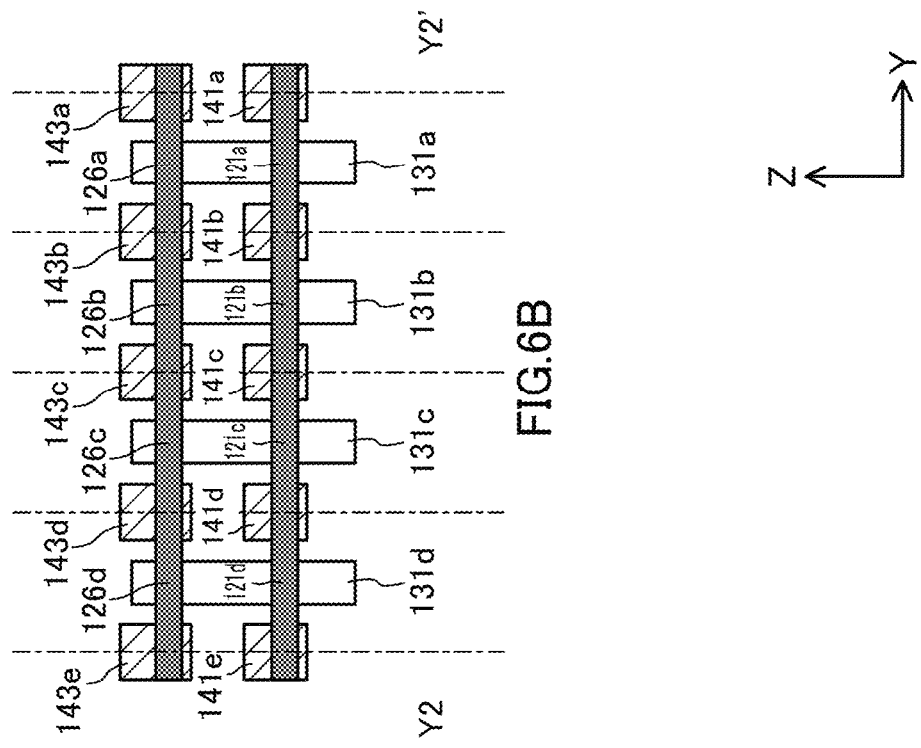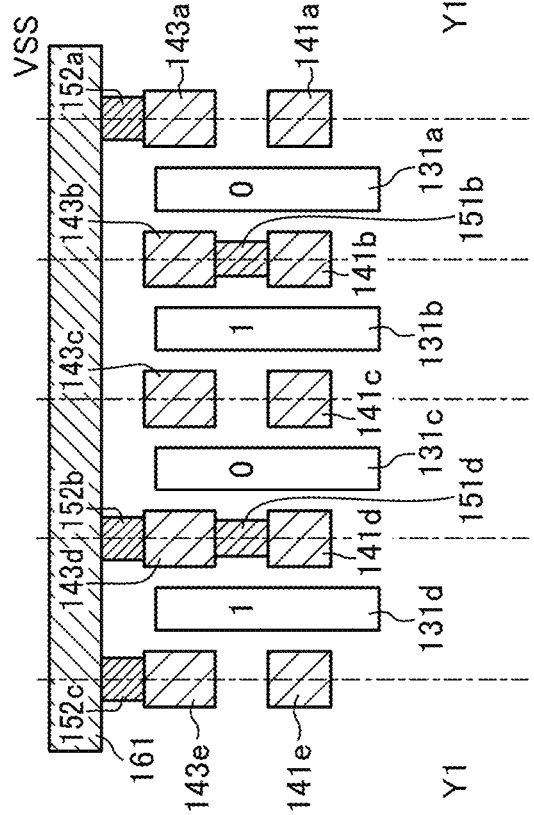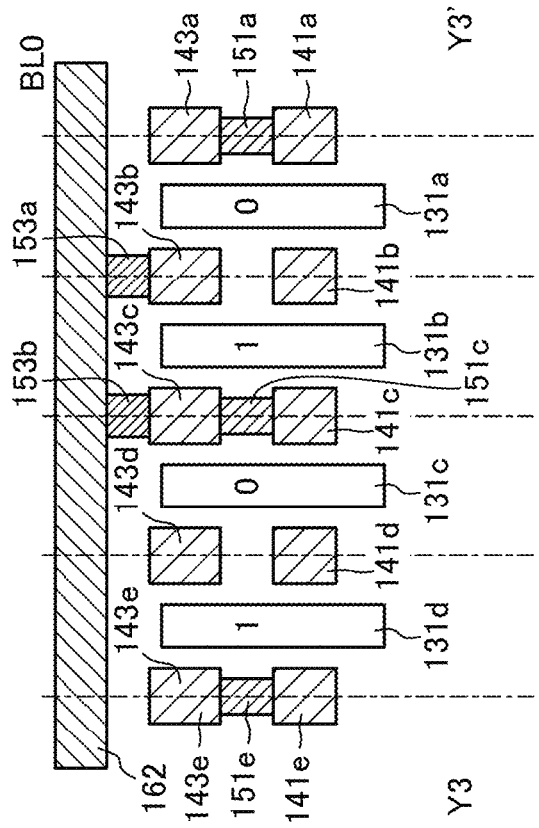

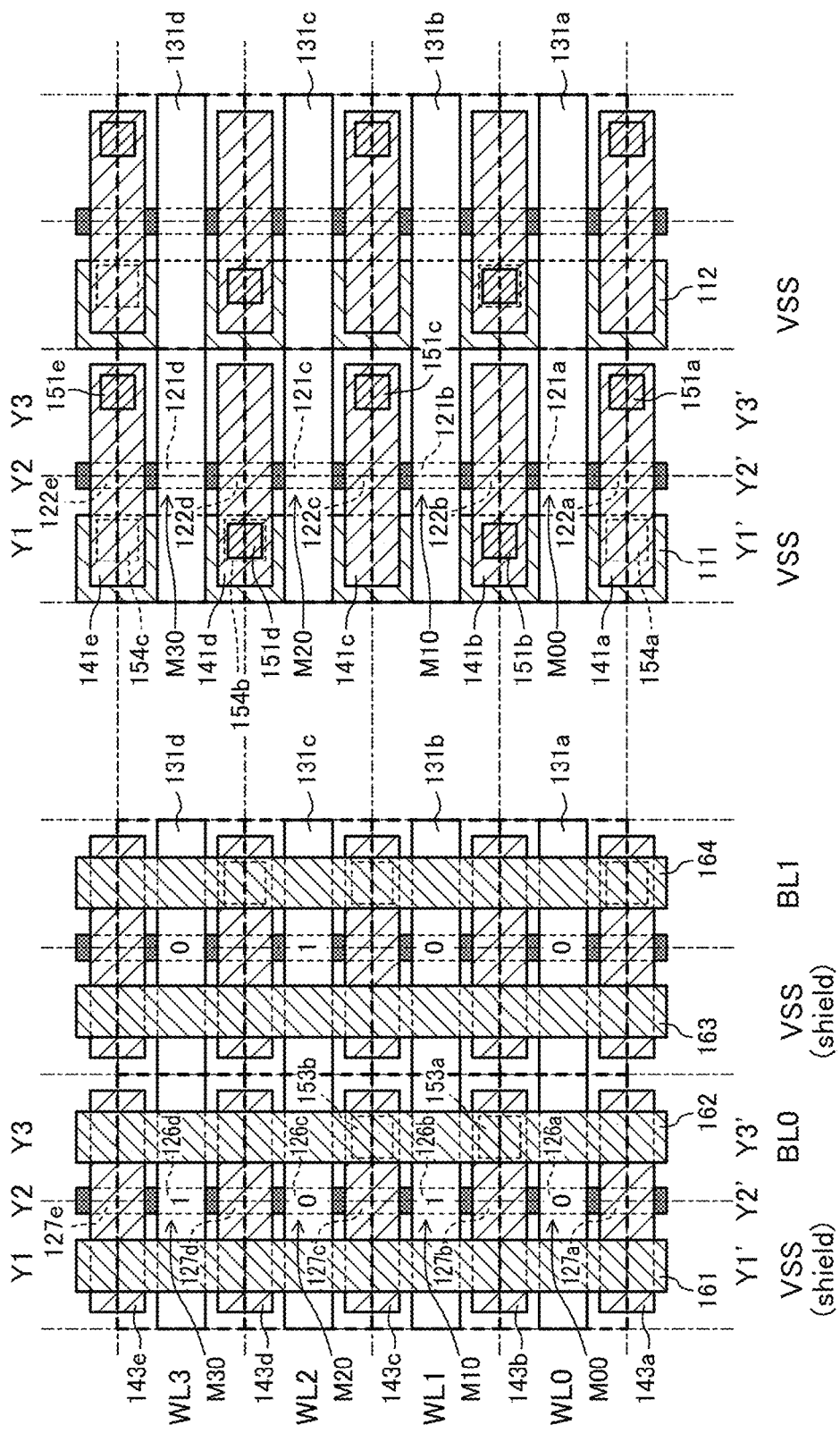
FIG.7A UPPER PART(Nch)   FIG.7B LOWER PART(Nch)

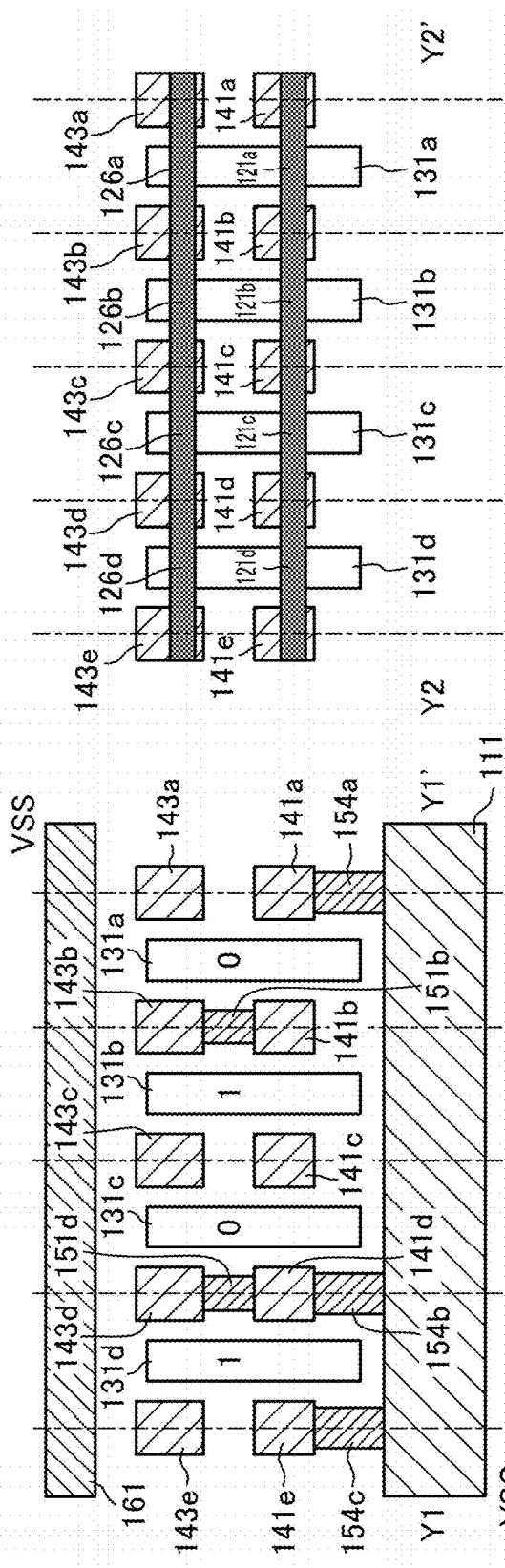

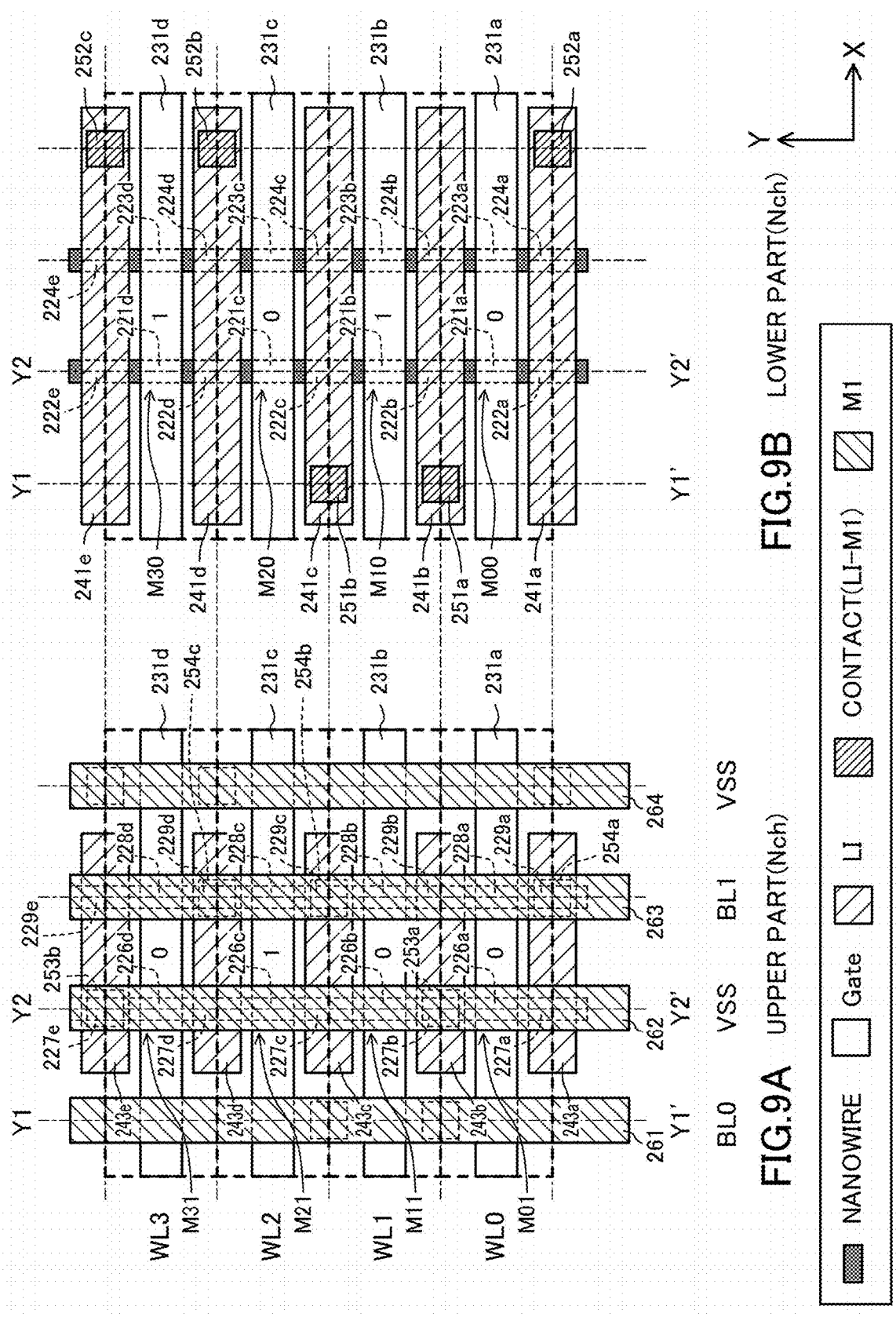

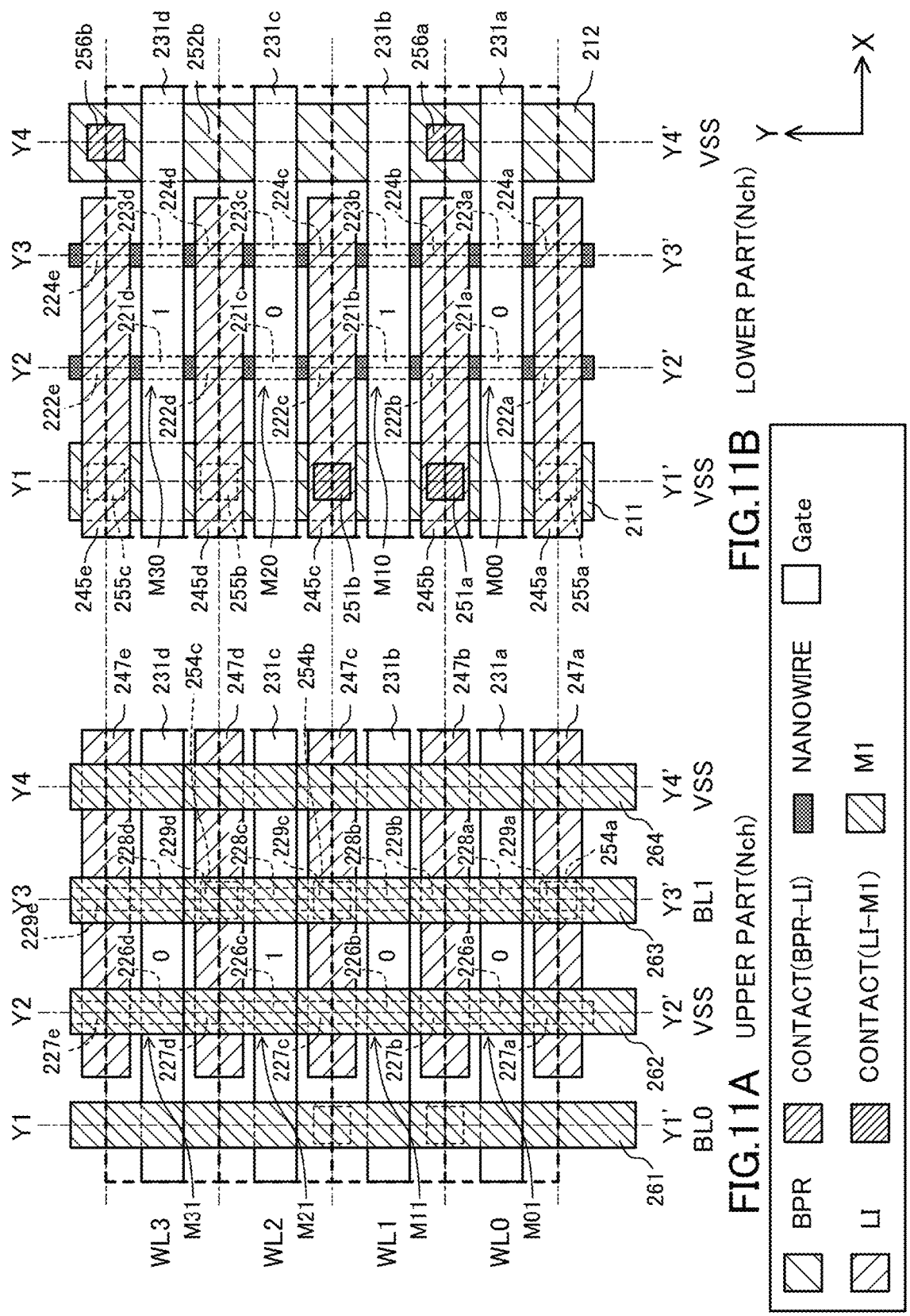

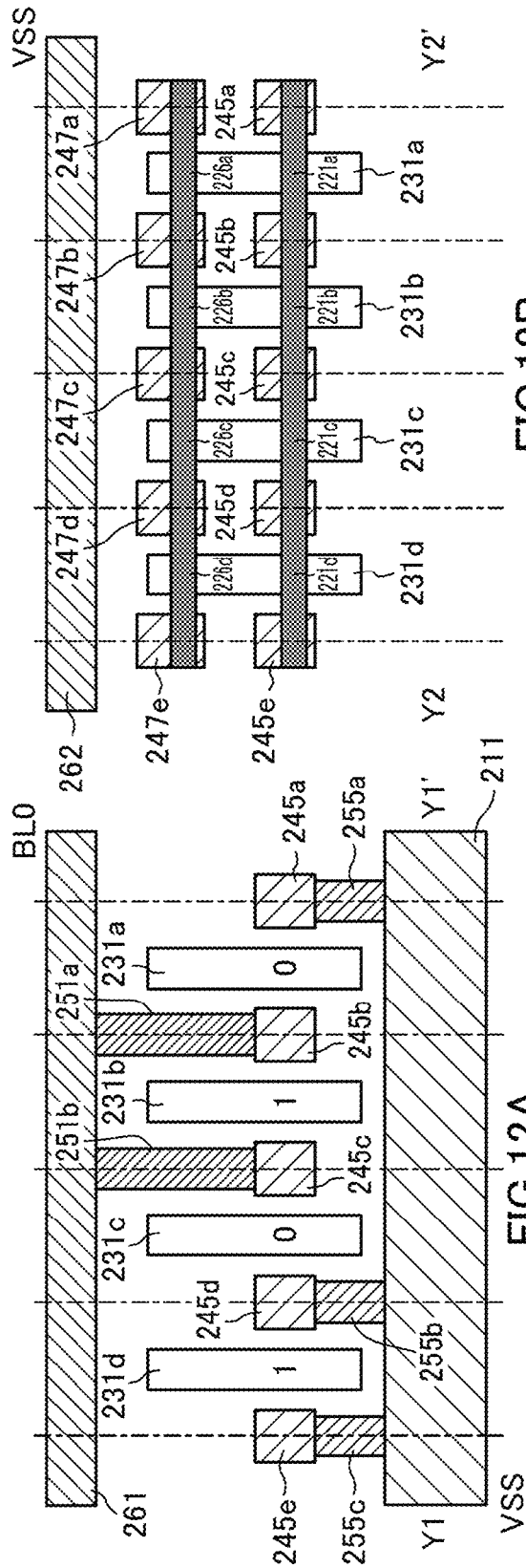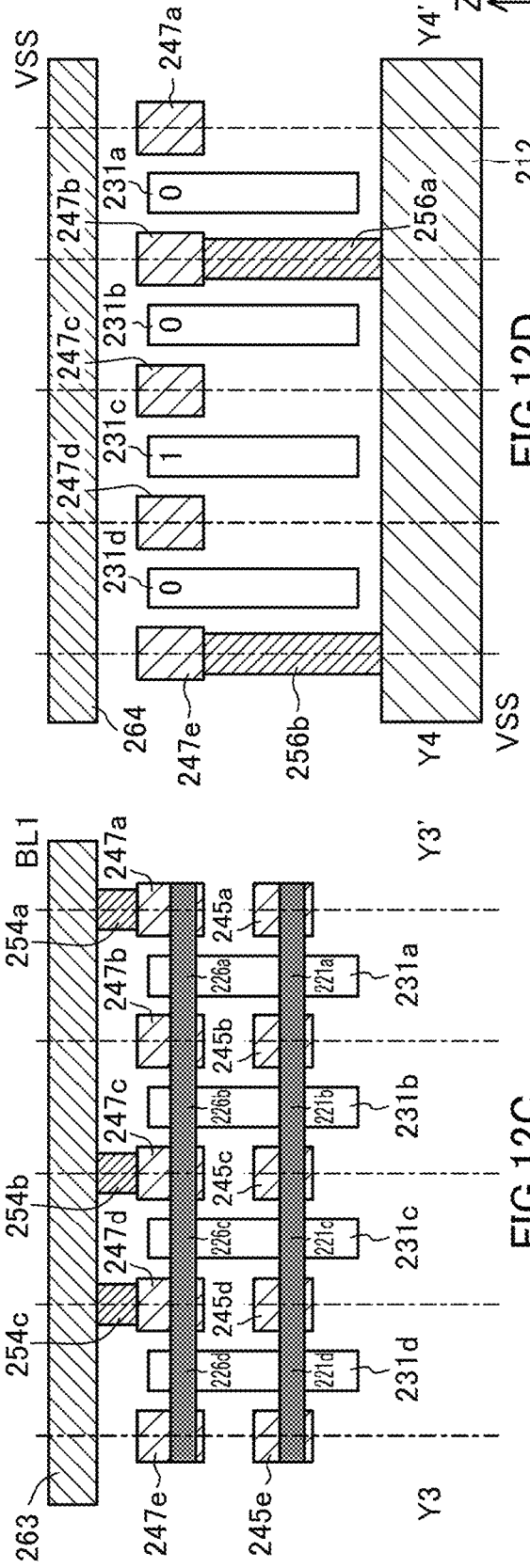

SEMICONDUCTOR STORAGE DEVICE

CROSS-REFERENCE TO RELATED APPLICATIONS

This is a continuation of International Application No. PCT/JP2020/018393 filed on May 1, 2020, which claims priority to Japanese Patent Application No. 2019-090699 filed on May 13, 2019. The entire disclosures of these applications are incorporated by reference herein.

BACKGROUND

The present disclosure relates to a semiconductor storage device using complementary FET (CFET) devices, and more particularly to a layout structure of a mask read only memory (ROM) using CFETs.

As for transistors as basic constituents of an LSI, scaling down of the gate length has led to the improvement in integration degree, the reduction in operating voltage, and the improvement in operating speed. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and standard cells using such devices.

A mask ROM includes memory cells arranged in an array, and the memory cells are programmed to have their fixed data states during manufacture. A transistor constituting a memory cell is provided between a bit line and VSS and connected with a word line at its gate. For example, a mask ROM disclosed in U.S. Pat. No. 5,917,224 stores data "1" or "0" depending on the connection state of whether the source and drain of a transistor are connected to a same line, or connected to different lines from each other, out of a bit line and a VSS line. In this mask ROM, adjacent transistors each constituting a memory cell share a source and a drain, whereby area reduction is achieved.

As used herein, a three-dimensional device in which three-dimensional p-type FET and n-type FET are stacked vertically to a substrate is called a complementary FET (CFET) following the cited paper by Ryckaert J. et al. Also, the direction vertical to the substrate is herein called the depth direction.

An objective of the present disclosure is providing a layout structure of a mask ROM using CFETs.

SUMMARY

According to the first mode of the present disclosure, a semiconductor storage device provided with a read only memory (ROM) cell includes: a word line extending in a first direction; first and second bit lines extending in a second direction perpendicular to the first direction; and a ground power supply line extending in the second direction, wherein the ROM cell includes a first transistor that is a three-dimensional transistor provided between the first bit line and the ground power supply line, a second transistor that is a three-dimensional transistor provided between the second bit line and the ground power supply line, formed above the first transistor, channel portions of the first and second transistors overlapping each other as viewed in plan, a first local interconnect connected to a source of the first transistor and connected to the first bit line or the ground power supply line, a second local interconnect connected to a drain of the first transistor and connected to the first bit line or the ground power supply line, a third local interconnect connected to a source of the second transistor and connected to the second bit line or the ground power supply line, and a fourth local interconnect connected to a drain of the second transistor and connected to the second bit line or the ground power supply line, gates of the first and second transistors are connected to the word line, and first data is stored in the ROM cell depending on whether the first and second local interconnects are connected to a same line, or different lines, out of the first bit line and the ground power supply line, and second data is stored in the ROM cell depending on whether the third and fourth local interconnects are connected to a same line, or different lines, out of the second bit line and the ground power supply line.

According to the above mode, the ROM cell includes the first transistor that is a three-dimensional transistor provided between the first bit line and the ground power supply line and the second transistor that is a three-dimensional transistor provided between the second bit line and the ground power supply line. The second transistor is formed above the first transistor, and the channel portions of the first and second transistors overlap each other as viewed in plan. First data is stored in the ROM cell depending on whether the first and second local interconnects connected to the source and drain of the first transistor are connected to a same line, or different lines, out of the first bit line and the ground power supply line. Also, second data is stored in the ROM cell depending on whether the third and fourth local interconnects connected to the source and drain of the second transistor are connected to a same line, or different lines, out of the second bit line and the ground power supply line. With this configuration, a small-area layout structure of a mask ROM can be implemented.

According to the second mode of the present disclosure, a semiconductor storage device provided with a read only memory (ROM) cell includes: a word line extending in a first direction; a bit line extending in a second direction perpendicular to the first direction; and a ground power supply line extending in the second direction, wherein the ROM cell includes a first transistor that is a three-dimensional transistor provided between the bit line and the ground power supply line, a second transistor that is a three-dimensional transistor provided between the bit line and the ground power supply line, formed above the first transistor, channel portions of the first and second transistors overlapping each other as viewed in plan, a first local interconnect connected to a source of the first transistor, a second local interconnect connected to a source of the second transistor, a third local interconnect connected to a drain of the first transistor, and a fourth local interconnect connected to a drain of the second transistor, gates of the first and second transistors are connected to the word line, the first and second local interconnects are mutually connected and also connected with the bit line or the ground power supply line, the third and fourth local interconnects are mutually connected and also connected with the bit line or the ground power supply line, and data is stored in the ROM cell depending on whether the paired first and second local interconnects and the paired third and fourth local interconnects are connected to a same line, or different lines, out of the bit line and the ground power supply line.

According to the above mode, the ROM cell includes the first transistor that is a three-dimensional transistor provided between the bit line and the ground power supply line and the second transistor that is a three-dimensional transistor provided between the bit line and the ground power supply line. The second transistor is formed above the first transistor, and the channel portions of the first and second transistors overlap each other as viewed in plan. The first local interconnect connected to the source of the first transistor and the second local interconnect connected to the source of the second transistor are mutually connected. The third local interconnect connected to the drain of the first transistor and the fourth local interconnect connected to the drain of the second transistor are mutually connected. Data is stored in the ROM cell depending on whether the paired first and second local interconnects and the paired third and fourth local interconnects are connected to a same line, or different lines, out of the bit line and the ground power supply line. With this configuration, a small-area layout structure of a mask ROM can be implemented.

According to the present disclosure, a layout structure of a mask ROM using CFETs can be provided.

BRIEF DESCRIPTION OF THE DRAWINGS

FIGS. 2A and 2B are plan views showing an example of a layout structure of memory cells according to the first embodiment.

FIGS. 4A and 4B are plan views showing an example of a layout structure of an inverter cell using a CFET.

FIGS. 5A and 5B are plan views showing an example of a layout structure of memory cells according to the second embodiment.

FIGS. 6A to 6C are cross-sectional views of the memory cells of FIGS. 5A-5B.

FIGS. 7A and 7B are plan views showing an example of a layout structure of memory cells according to an alteration of the second embodiment.

FIGS. 8A to 8C are cross-sectional views of the memory cells of FIGS. 7A-7B.

FIGS. 9A and 9B are plan views showing an example of a layout structure of memory cells according to the third embodiment.

FIGS. 11A and 11B are plan views showing an example of a layout structure of memory cells according to an alteration of the third embodiment.

FIGS. 12A to 12D are cross-sectional views of the memory cells of FIGS. 11A-11B.

DETAILED DESCRIPTION

Figure 13:
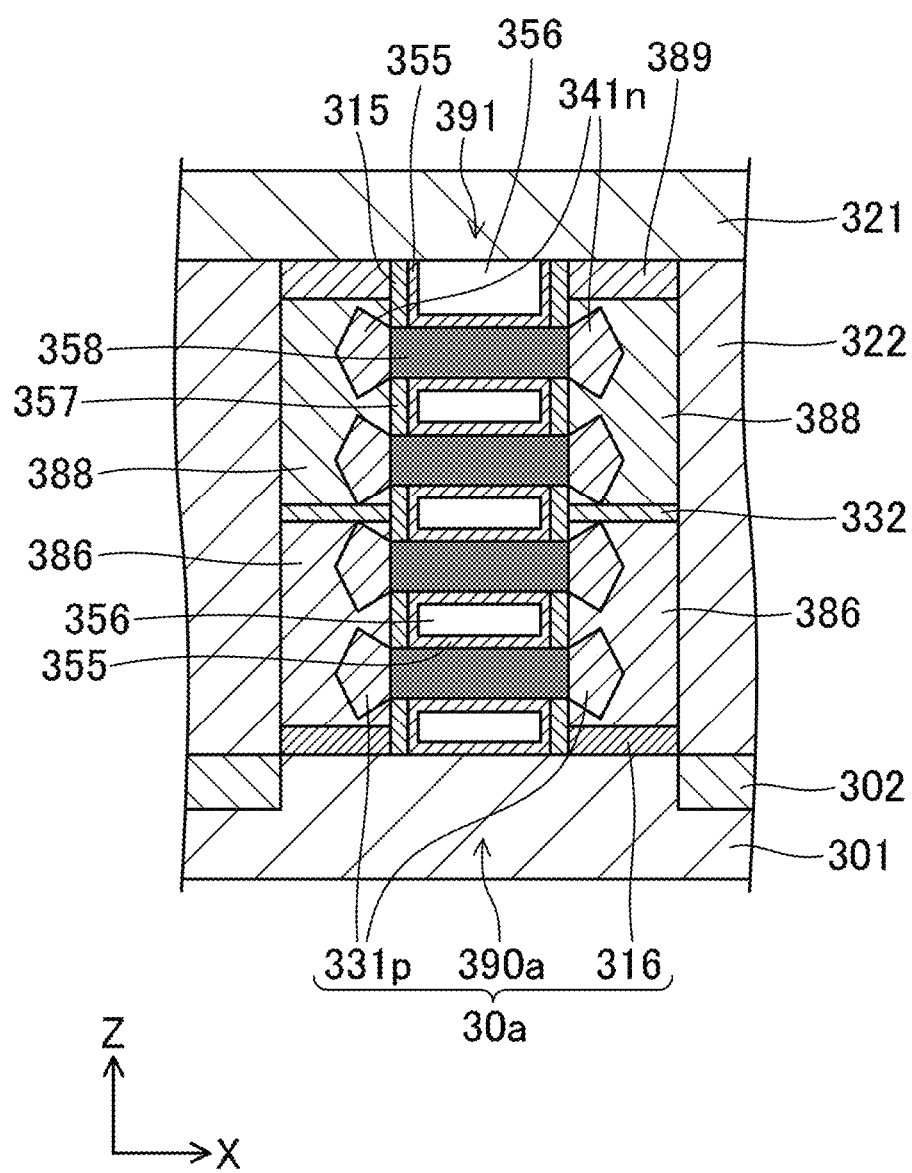
FIG. 13 is a cross-sectional view showing a structure of a semiconductor device provided with a CFET.
Figure 14:
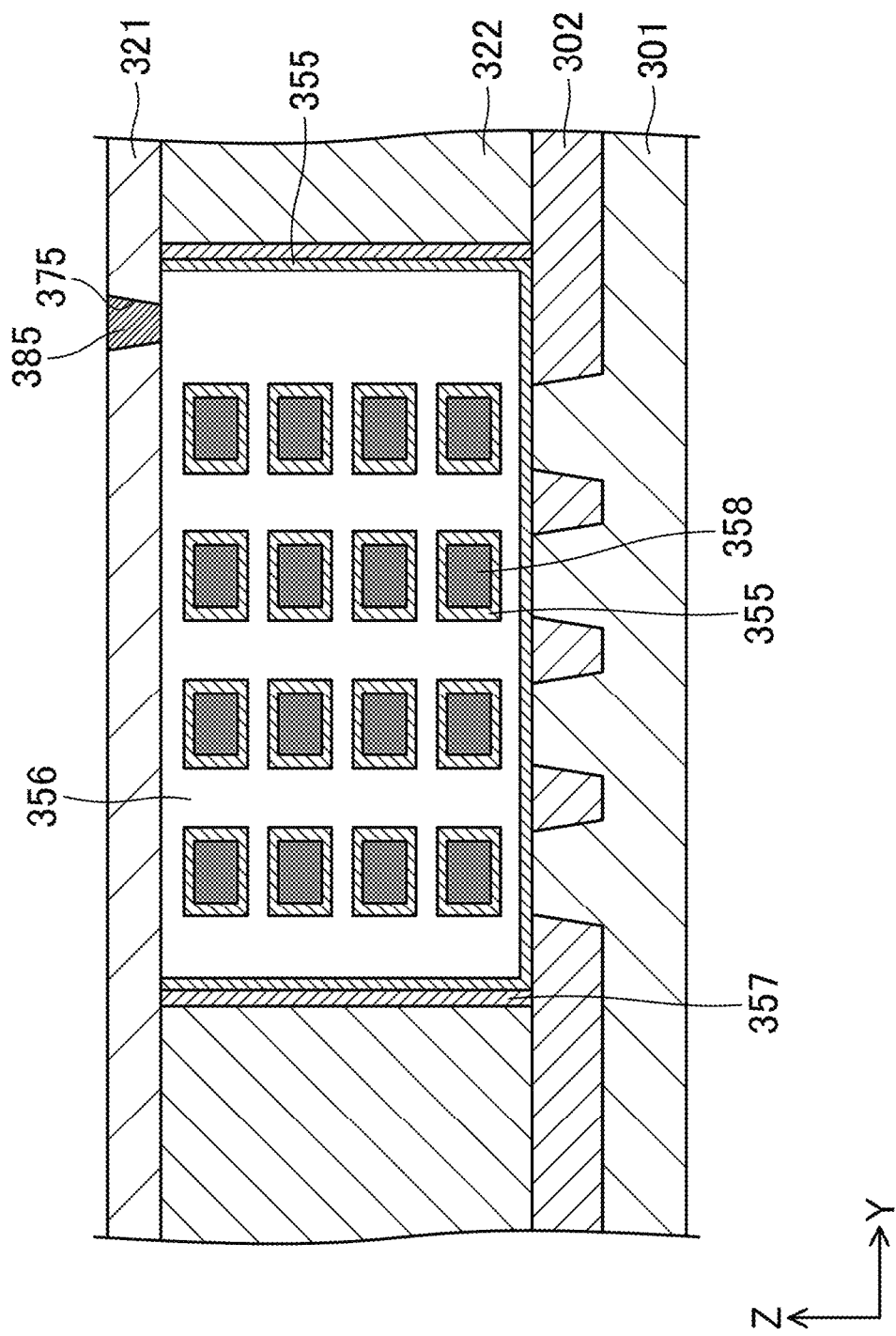
FIG. 14 is a cross-sectional view showing the structure of the semiconductor device provided with a CFET.
Figure 15:
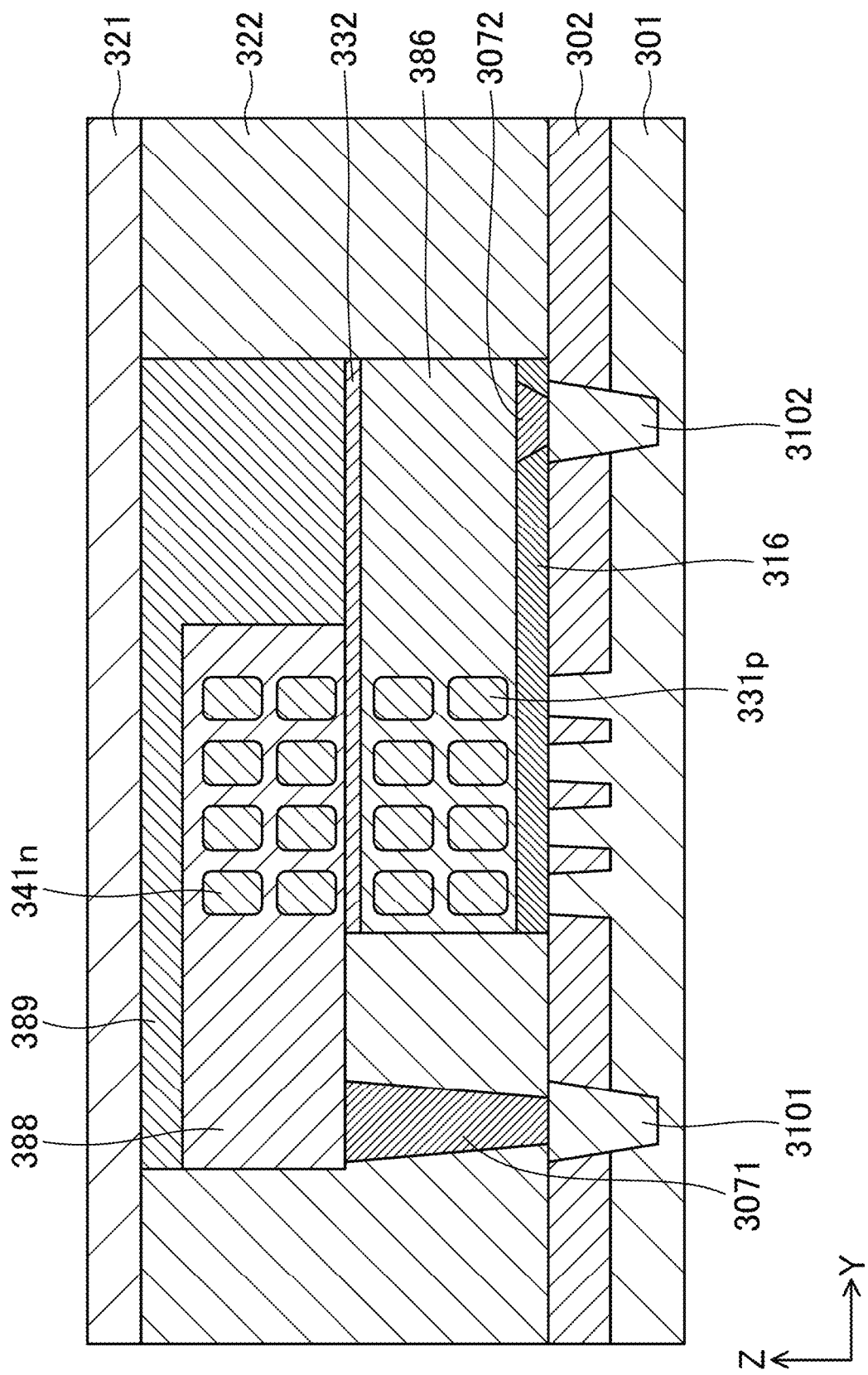
FIG. 15 is a cross-sectional view showing the structure of the semiconductor device provided with a CFET.
Figure 16:
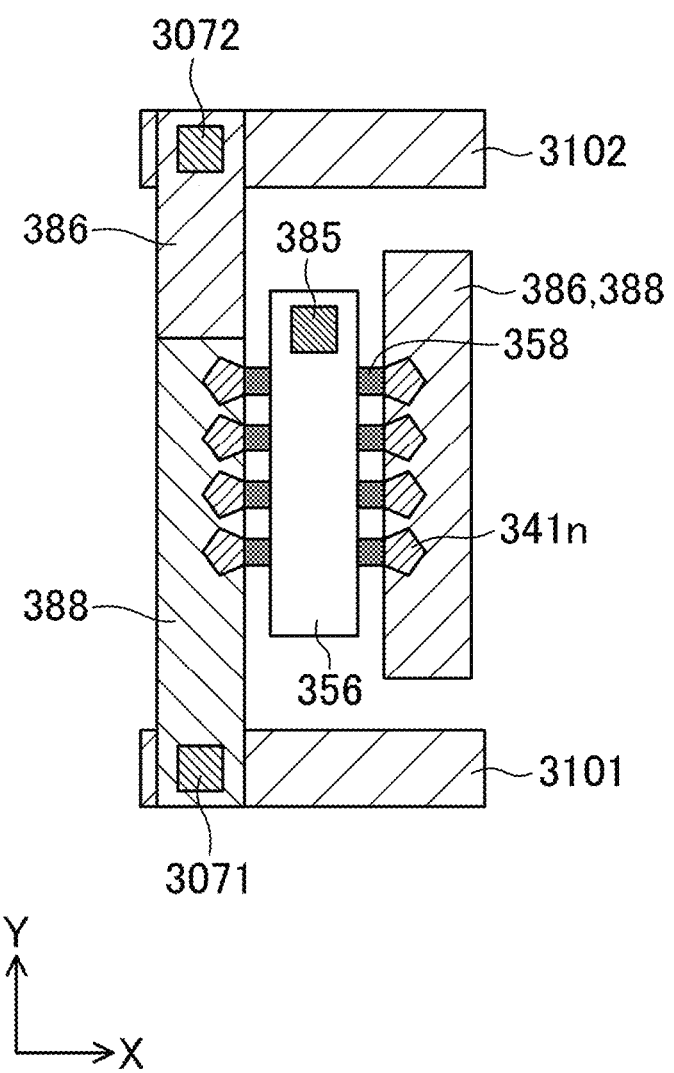
FIG. 16 is a plan view showing the structure of the semiconductor device provided with a CFET.

First, the basic structure of the CFET will be described. FIGS. 13 to 16 are views showing a structure of a semiconductor device provided with a CFET, where FIG. 13 is a cross-sectional view taken in an X direction, FIG. 14 is a cross-sectional view of a gate portion taken in a Y direction, FIG. 15 is a cross-sectional view of a source/drain portion taken in the Y direction, and FIG. 16 is a plan view. Note that the X direction refers to the direction in which nanowires extend, the Y direction refers to the direction in which a gate extends, and a Z direction refers to the direction vertical to the substrate plane. Note also that FIGS. 13 to 16 are schematic views in which the dimensions and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 14, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 15, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

As used herein, a semiconductor layer portion formed on each end of a nanowire to constitute a terminal that is to be the source or drain of a transistor is called a "pad". In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads at both ends of the nanowires may be illustrated in simplified linear shapes in some cases. Also, as used herein, an expression indicating that sizes, etc. are identical, such as the "same size," is to be understood as including a range of manufacturing variations.

Note that, in the following embodiments, the source and drain of a transistor may be called the nodes of the transistor.

Figure 1:
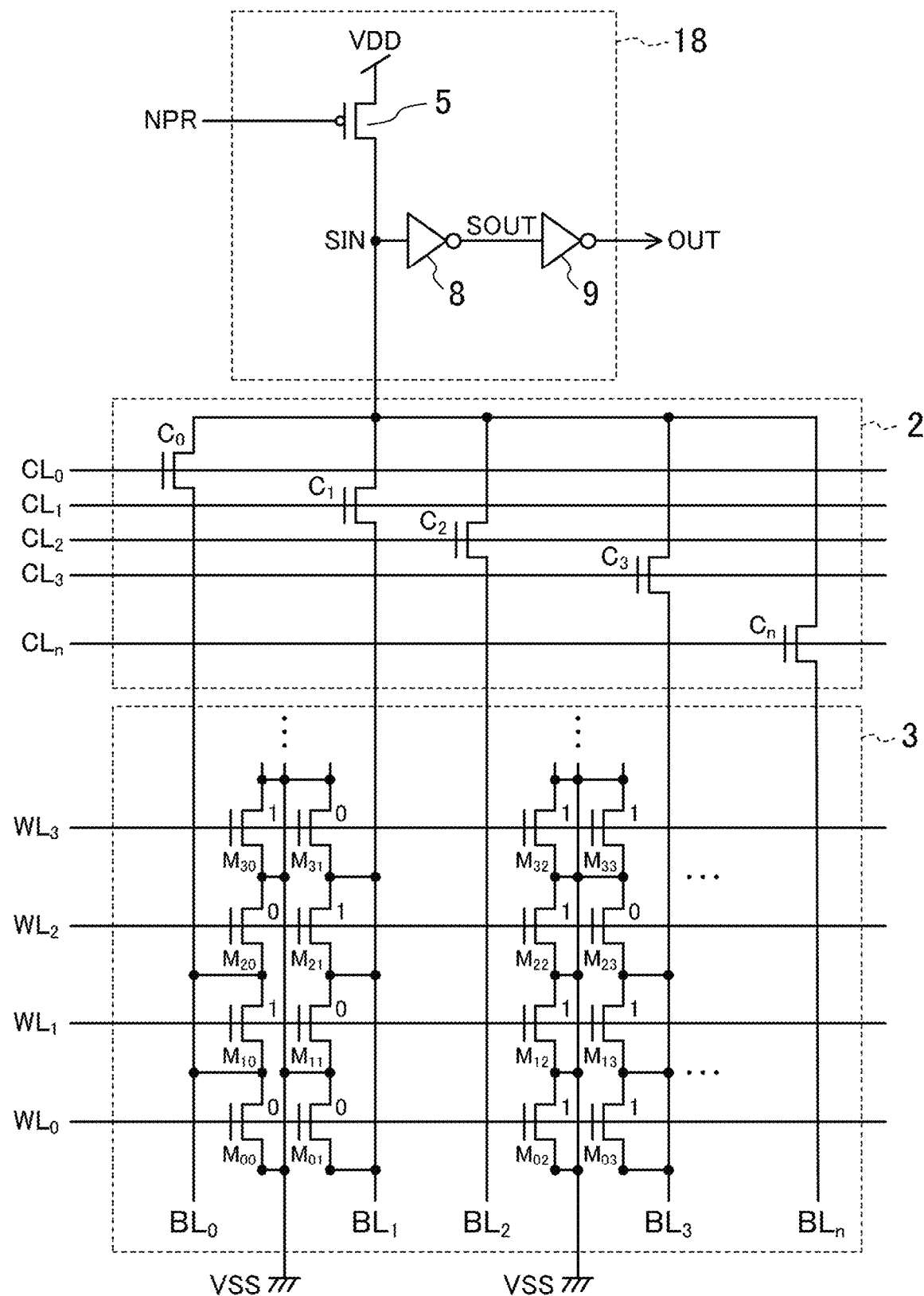
FIG. 1 is a circuit diagram showing a configuration of a contact-type mask ROM as an example of a semiconductor storage device.

FIG. 1 is a circuit diagram showing a configuration of a mask ROM as an example of a semiconductor storage device. The mask ROM of FIG. 1 is a ROM in which whether the source and drain of a memory cell transistor are connected to a same line, or different lines, out of a bit line and a ground power supply line is made to correspond to "1" or "0" of memory data.

In FIG. 1, the mask ROM includes a memory cell array 3, a column decoder 2, and a sense amplifier 18.

The memory cell array 3 is constituted by memory cells Mij (i=0 to m, j=0 to n) of n-type MOS transistors arranged in a matrix. The gates of the memory cells Mij are connected to corresponding word lines WLi that are common for each row. The sources and drains of the memory cells Mij are connected to corresponding bit lines BLj or the ground power supply line VSS. When the memory data of a memory cell Mij is intended to be "0", one of the source and the drain is connected to a bit line BLj and the other is connected to the ground power supply line VSS. On the contrary, when the memory data of a memory cell Mij is intended to be "1", both the source and the drain are connected to a bit line BLj or the ground power supply line VSS.

The column decoder 2 is constituted by n-type MOS transistors Cj. The drains of the n-type MOS transistors Cj are all connected together as a common drain, the gates thereof are connected to corresponding column selection signal lines CLj, and the sources thereof are connected to the corresponding bit lines BLj.

The sense amplifier 18 includes a precharge p-type MOS transistor 5, an inverter 8 that determines the output data of the memory cells Mij, and an inverter 9 that buffers the output signal of the inverter 8. A precharge signal NPR is input into the gate of the p-type MOS transistor 5, the power supply voltage VDD is supplied to the source thereof, and the drain thereof is connected to the common drain of the n-type MOS transistors Cj. The inverter 8, receiving a signal SIN of the common drain of the n-type MOS transistors Cj, determines the output data of the memory cells Mij. The inverter 9, receiving an output signal SOUT of the inverter 8, outputs memory data of the memory cells Mij.

The operation of the mask ROM of FIG. 1 will be described taking as an example the case of reading data of memory cells M00 and M10.

First, among the column selection signal lines CLj, CL0 is made high and the other CL1 to CLn are made low. This turns on C0, among the transistors constituting the column decoder 2, and turns off the other transistors C1 to Cn. Also, the word line WL0 is changed from a low level as the non-selected state to a high level as the selected state.

The precharge signal NPR is then changed from high to low, to turn on the precharge p-type MOS transistor 5.

In the memory cell M00, one of the source and the drain is connected to the bit line BL0 and the other is connected to the ground power supply line VSS. Therefore, since a current flows from the bit line BL0 to the ground power supply line VSS through the memory cell M00, the voltage of the input signal SIN at the inverter 8 becomes lower than the switching level of the inverter 8. Thus, the output signal SOUT of the inverter 8 keeps high, and an output signal OUT of the inverter 9 keeps low.

In reading data of the memory cell M10, the word line WL1 is changed from the low level as the non-selected state to the high level as the selected state.

In the memory cell M10, both the source and the drain are connected to the bit line BL0. Therefore, since no current flows to the bit line BL0, the voltage of the input signal SIN at the inverter 8 becomes higher than the switching level of the inverter 8. Thus, the output signal SOUT of the inverter 8 becomes low, and the output signal OUT of the inverter 9 becomes high.

That is, when one of the source and drain of a memory cell is connected to a bit line and the other is connected to the ground power supply line, a low level is output (memory data "0"), and when both the source and drain of a memory cell are connected to a bit line or the ground power supply line, a high level is output (memory data "1").

First Embodiment

Figure 3A:
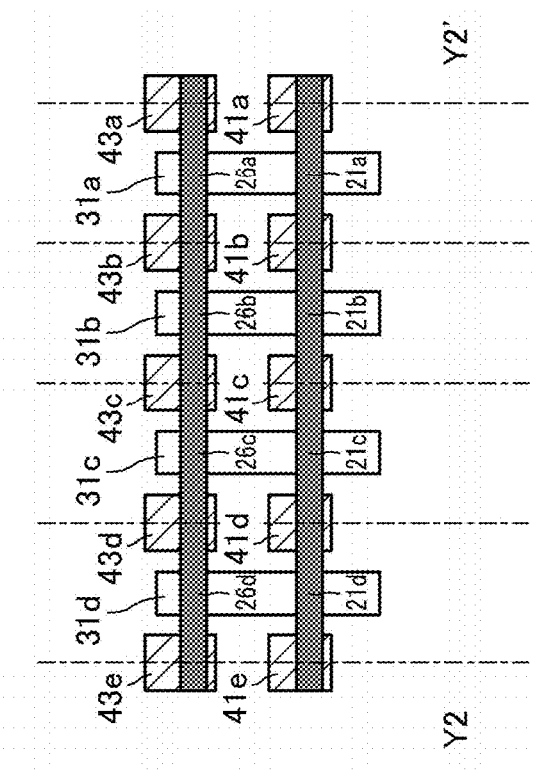
FIGS. 3A to 3C are cross-sectional views of the memory cells of FIGS. 2A-2B.
Figure 3B:
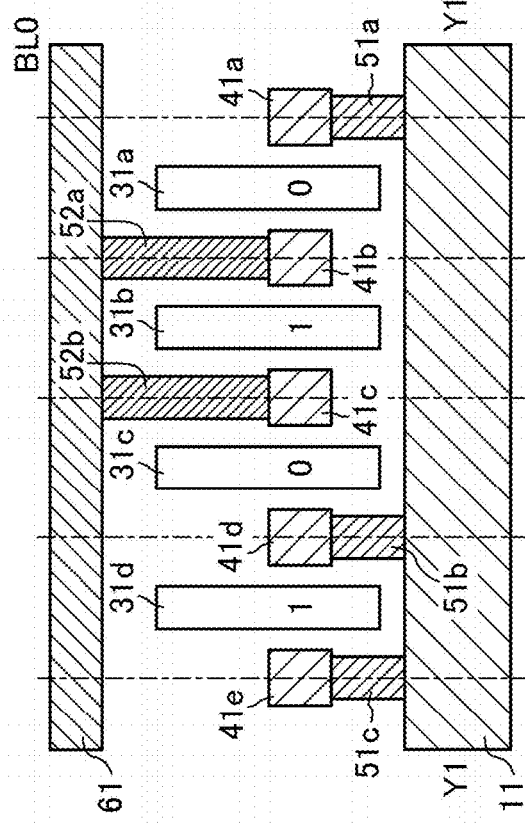
Figure 3C:
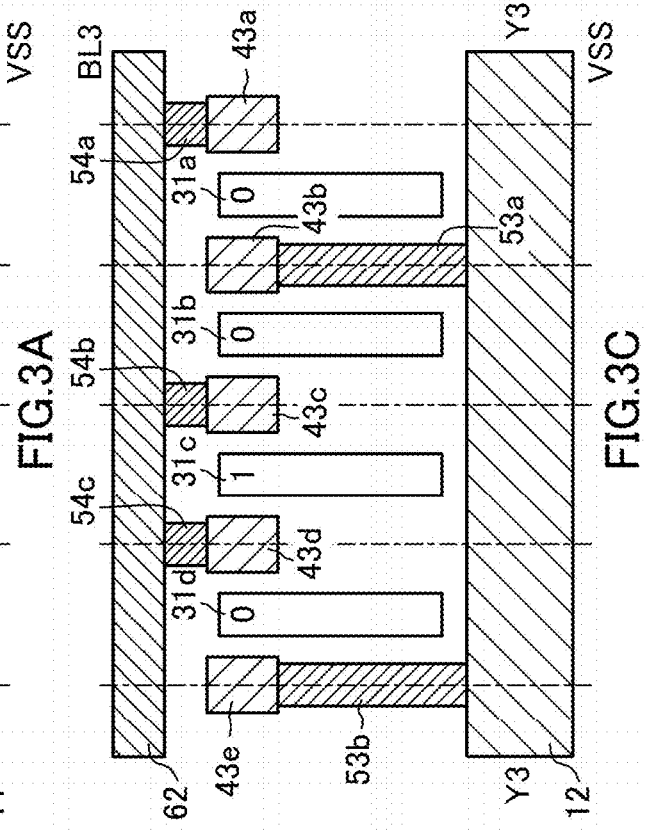

FIGS. 2A-2B and 3A-3C are views showing an example of a layout structure of a mask ROM according to the first embodiment, where FIGS. 2A-2B are plan views of memory cells, and FIGS. 3A-3C are cross-sectional views of the memory cells taken in the vertical direction as viewed in plan. Specifically, FIG. 2A shows an upper part, i.e., a portion including three-dimensional transistors formed away from a substrate (n-type nanowire FETs in the illustrated example), and FIG. 2B shows a lower part, i.e., a portion including three-dimensional transistors formed closer to the substrate (n-type nanowire FETs in the illustrated example). FIG. 3A shows a cross section taken along line Y1-Y1', FIG. 3B shows a cross section taken along line Y2-Y2', and FIG. 3C shows a cross section taken along line Y3-Y3'.

In the following description, in the plan views such as FIGS. 2A-2B, the horizontal direction in the figure is called an X direction (corresponding to the first direction), the vertical direction in the figure is called a Y direction (corresponding to the second direction), and the direction vertical to the substrate plane is called the Z direction (corresponding to the depth direction). Note that the X direction is a direction in which gate interconnects and word lines extend and the Y direction is a direction in which nanowires and bit lines extend. That is, in the drawings for this and subsequent embodiments, the X and Y directions are reversed from those in FIGS. 13 to 16. The dotted lines running horizontally and vertically in the plan views such as FIGS. 2A-2B and the dotted lines running vertically in the cross-sectional views such as FIGS. 3A-3C represent grid lines used for placement of components at the time of designing. The grid lines are placed at equal spacing in the X direction and placed at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

Also, the memory value "0" or "1" of each memory cell is indicated in the drawings.

FIGS. 2A-2B correspond to a layout of 16 bits of memory cells, four arranged in the horizontal direction and four in the vertical direction, in the memory cell array 3 in FIG. 1. Transistors connected to the bit lines BL0 and BL2 are formed in the lower part shown in FIG. 2B, and transistors connected to the bit lines BL1 and BL3 are formed in the upper part shown in FIG. 2A. That is, the transistors shown in FIGS. 2A-2B correspond to n-type transistors respectively constituting 16 memory cells Mij (i=0 to 3, J=0 to 3) in the circuit diagram of FIG. 1, for example. The broken line defines the bounds of each memory cell. In the following description, n-type transistors constituting memory cells Mij are also referred to as n-type transistors Mij.

As shown in FIG. 2B, power supply lines 11, 12, 13, and 14 extending in the Y direction are provided on both ends of the memory cells in the X direction. The power supply lines 11, 12, 13, and 14 are all buried power rails (BPRs) formed in a buried interconnect layer. The power supply lines 11, 12, 13, and 14 supply the power supply voltage VSS.

As shown in FIG. 2A, interconnects 61, 62, 63, and 64 extending in the Y direction are formed in an M1 interconnect layer. The M1 interconnect 61 corresponds to the bit line BL0, the M1 interconnect 62 corresponds to the bit line BL1, the M1 interconnect 63 corresponds to the bit line BL2, and the M1 interconnect 64 corresponds to the bit line BL3.

Described hereinafter will be the layout structure of the memory cells in the left column in the figure, i.e., the memory cells provided for the bit lines BL0 and BL1. Note that the layout of the memory cells in the right column in the figure, i.e., the memory cells provided for the bit lines BL2 and BL3 is similar to that of the memory cells in the left column, except that the lines to which the nodes of the transistors are connected are different.

Nanowires 21a, 21b, 21c, and 21d extending in the Y direction are formed in the lower part of the memory cells, and nanowire 26a, 26b, 26c, and 26d extending in the Y direction are formed in the upper part of the memory cells. The nanowires 21a and 26a overlap each other as viewed in plan, the nanowires 21b and 26b overlap each other as viewed in plan, the nanowires 21c and 26c overlap each other as viewed in plan, and the nanowires 21d and 26d overlap each other as viewed in plan.

Pads 22a, 22b, 22c, 22d, and 22e doped with an n-type semiconductor are formed at the lower end of the nanowire 21a, between the nanowires 21a and 21b, between the nanowires 21b and 21c, between the nanowires 21c and 21d, and at the upper end of the nanowire 21d, respectively. Pads 27a, 27b, 27c, 27d, and 27e doped with an n-type semiconductor are formed at the lower end of the nanowire 26a, between the nanowires 26a and 26b, between the nanowires 26b and 26c, between the nanowires 26c and 26d, and at the upper end of the nanowire 26d, respectively.

The nanowire 21a constitutes the channel portion of the n-type transistor M00, and the pads 22a and 22b constitute the nodes of the n-type transistor M00. The nanowire 21b constitutes the channel portion of the n-type transistor M10, and the pads 22b and 22c constitute the nodes of the n-type transistor M10. The pad 22b is shared by the n-type transistors M00 and M10. The nanowire 21c constitutes the channel portion of the n-type transistor M20, and the pads 22c and 22d constitute the nodes of the n-type transistor M20. The pad 22c is shared by the n-type transistors M10 and M20. The nanowire 21d constitutes the channel portion of the n-type transistor M30, and the pads 22d and 22e constitute the nodes of the n-type transistor M30. The pad 22d is shared by the n-type transistors M20 and M30.

The nanowire 26a constitutes the channel portion of the n-type transistor M01, and the pads 27a and 27b constitute the nodes of the n-type transistor M01. The nanowire 26b constitutes the channel portion of the n-type transistor M11, and the pads 27b and 27c constitute the nodes of the n-type transistor M11. The pad 27b is shared by the n-type transistors M01 and M11. The nanowire 26c constitutes the channel portion of the n-type transistor M21, and the pads 27c and 27d constitute the nodes of the n-type transistor M21. The pad 27c is shared by the n-type transistors M11 and M21. The nanowire 26d constitutes the channel portion of the n-type transistor M31, and the pads 27d and 27e constitute the nodes of the n-type transistor M31. The pad 27d is shared by the n-type transistors M21 and M31.

The n-type transistors M00, M10, M20, and M30 are formed above the buried interconnect layer in the Z direction, and the n-type transistors M01, M11, M21, and M31 are formed above the n-type transistors M00, M10, M20, and M30 in the Z direction.

Gate interconnects 31a, 31b, 31c, and 31d extend in the X direction and also extend in the Z direction over the lower and upper parts of the memory cells. The gate interconnect 31a is to be the gates of the n-type transistors M00 and M01. That is, the n-type transistor M00 is constituted by the nanowire 21a, the gate interconnect 31a, and the pads 22a and 22b. The n-type transistor M01 is constituted by the nanowire 26a, the gate interconnect 31a, and the pads 27a and 27b. Likewise, the gate interconnect 31b is to be the gates of the n-type transistors M10 and M11, the gate interconnect 31c is to be the gates of the n-type transistors M20 and M21, and the gate interconnect 31d is to be the gates of the n-type transistors M30 and M31. The gate interconnects 31a, 31b, 31c, and 31d are connected to the word lines WL0, WL1, WL2, WL3, respectively.

In the lower part of the memory cells, local interconnects 41a, 41b, 41c, 41d, and 41e extending in the X direction are formed. The local interconnects 41a, 41b, 41c, 41d, and 41e are connected with the pads 22a, 22b, 22c, 22d, and 22e, respectively, and extend leftward from the pad pads 22a, 22b, 22c, 22d, and 22e in the figure. In the upper part of the memory cells, local interconnects 43a, 43b, 43c, 43d, and 43e extending in the X direction are formed. The local interconnects 43a, 43b, 43c, 43d, and 43e are connected with the pads 27a, 27b, 27c, 27d, and 27e, respectively, and extend rightward from the pad pads 27a, 27b, 27c, 27d, and 27e in the figure.

The local interconnects 41a, 41d, and 41e are connected with the power supply line 11 through contacts 51a, 51b, and 51c, respectively. The local interconnects 41b and 41c are connected with the M1 interconnect 61 through contacts 52a and 52b, respectively. That is, in the n-type transistors M00 and M20, one of the nodes is connected to the power supply line 11, and the other node is connected to the M1 interconnect 61. In the n-type transistor M10, both nodes are connected to the M1 interconnect 61. In the n-type transistor M30, both nodes are connected to the power supply line 11.

The local interconnects 43b and 43e are connected with the power supply line 12 through contacts 53a and 53b, respectively. The local interconnects 43a, 43c, and 43d are connected with the M1 interconnect 62 through contacts 54a, 54b, and 54c, respectively. That is, in the n-type transistors M01, M11, and M31, one of the nodes is connected to the power supply line 12, and the other node is connected to the M1 interconnect 62. In the n-type transistor M21, both nodes are connected to the M1 interconnect 62.

As described above, according to this embodiment, a ROM cell includes the transistor M00 provided between the M1 interconnect 61 corresponding to the bit line BL0 and the power supply line 11 that supplies VSS and the transistor M01 provided between the M1 interconnect 62 corresponding to the bit line BL1 and the power supply line 12 that supplies VSS. The transistor M01 is formed above the transistor M00, and the channel portions of the transistors M00 and M01 overlap each other as viewed in plan. First data is stored in the ROM cell depending on whether the local interconnects 41a and 41b connected to the source and drain of the transistor M00, respectively, are connected to a same line, or different lines, out of the M1 interconnect 61 and the power supply line 11. Also, second data is stored in the ROM cell depending on whether the local interconnects 43a and 43b connected to the source and drain of the transistor M01, respectively, are connected to a same line, or different lines, out of the M1 interconnect 62 and the power supply line 12. In this way, a small-area layout structure of a mask ROM can be implemented.

The upper transistor and the lower transistor are both n-type transistors, forming separate memory cells. Also, the nodes of transistors of adjacent memory cells in the Y direction are shared. This achieves reduction in the area of the semiconductor storage device.

In a general CFET, the upper and lower transistors are different in conductivity type. FIGS. 4A-4B show a layout structure of an inverter cell using a CFET. An upper transistor N1 shown in FIG. 4A is an n-type transistor, and a lower transistor P1 shown in FIG. 4B is a p-type transistor. The transistor P1 and the transistor N1 are connected in series between a power supply line 611 supplying VDD and a power supply line 612 supplying VSS. The transistor P1 has a nanowire 621 that is to be a channel portion and pads 622a and 622b, and the transistor N1 has a nanowire 626 that is to be a channel portion and pads 627a and 627b. A gate interconnect 631 is to be the common gate of the transistor P1 and the transistor N1. An M1 interconnect 661 that is to be the input of the inverter is connected with the gate interconnect 631. An M1 interconnect 662 that is to be the output of the inverter is connected with local interconnects 642 and 644 connected with the drains of the transistor P1 and the transistor N1.

On the contrary, in the mask ROM of this embodiment, both the upper and lower transistors are n-type transistors. That is, a semiconductor chip having the mask ROM of this embodiment includes a region where the lower part of a CFET is a p-type transistor and a region where it is an n-type transistor. In such a semiconductor chip, transistors in the lower part may be manufactured in the following manner, for example. That is, at the time of formation of transistors in the lower part, the portion for n-type transistors is masked to dope the other portion into p-type conductivity. Thereafter, the portion other than the portion for n-type transistors is masked to dope the portion for n-type transistors into n-type conductivity. By placing n-type transistors and p-type transistors away from each other, the p-type doping and the n-type doping can be performed without fail.

Second Embodiment

FIGS. 5A-5B and 6A-6C are views showing an example of a layout structure of a mask ROM according to the second embodiment, where FIGS. 5A-5B are plan views of memory cells, and FIGS. 6A-6C are cross-sectional views of the memory cells taken in the vertical direction as viewed in plan. Specifically, FIG. 5A shows an upper part and FIG. 5B shows a lower part. FIG. 6A shows a cross section taken along line Y1-Y1', FIG. 6B shows a cross section taken along line Y2-Y2', and FIG. 6C shows a cross section taken along line Y3-Y3'.

FIGS. 5A-5B correspond to a layout of eight bits of memory cells, two arranged in the horizontal direction and four in the vertical direction, in the memory cell array 3 in FIG. 1. One bit of memory cell is constituted by one n-type transistor formed in the upper part shown in FIG. 5A and one n-type transistor formed in the lower part shown in FIG. 5B. That is, the transistors shown in FIGS. 5A-5B correspond to eight n-type transistors Mij (i=0 to 3, j=0, 1) shown in the circuit diagram of FIG. 1, for example. The broken line defines the bounds of each memory cell.

As shown in FIG. 5A, interconnects 161, 162, 163, and 164 extending in the Y direction are formed in an M1 interconnect layer. The M1 interconnects 161 and 163 supply the power supply voltage VSS, the interconnect 162 corresponds to the bit line BL0, and the interconnect 164 corresponds to the bit line BL1.

Described hereinafter will be the layout structure of the memory cells in the left column in the figure, i.e., the memory cells provided for the bit line BL0. Note that the layout of the memory cells in the right column in the figure, i.e., the memory cell provided for the bit line BL1 is similar to that of the memory cells in the left column, except that the lines to which the nodes of the transistors are connected are different.

Nanowires 121a, 121b, 121c, and 121d extending in the Y direction are formed in the lower part of the memory cells, and nanowire 126a, 126b, 126c, and 126d extending in the Y direction are formed in the upper part of the memory cells. The nanowires 121a and 126a overlap each other as viewed in plan, the nanowires 121b and 126b overlap each other as viewed in plan, the nanowires 121c and 126c overlap each other as viewed in plan, and the nanowires 121d and 126d overlap each other as viewed in plan.

Pads 122a, 122b, 122c, 122d, and 122e doped with an n-type semiconductor are formed at the lower end of the nanowire 121a, between the nanowires 121a and 121b, between the nanowires 121b and 121c, between the nanowires 121c and 121d, and at the upper end of the nanowire 121d, respectively. Pads 127a, 127b, 127c, 127d, and 127e doped with an n-type semiconductor are formed at the lower end of the nanowire 126a, between the nanowires 126a and 126b, between the nanowires 126b and 126c, between the nanowires 126c and 126d, and at the upper end of the nanowire 126d, respectively.

The nanowires 121a and 126a constitute the channel portion of the n-type transistor M00, and the pads 122a, 122b, 127a, and 127b constitute the nodes of the n-type transistor M00. The nanowires 121b and 126b constitute the channel portion of the n-type transistor M10, and the pads 122b, 122c, 127b, and 127c constitute the nodes of the n-type transistor M10. The pads 122b and 127b are shared by the n-type transistors M00 and M10. The nanowires 121c and 126c constitute the channel portion of the n-type transistor M20, and the pads 122c, 122d, 127c, and 127d constitute the nodes of the n-type transistor M20. The pads 122c and 127c are shared by the n-type transistors M10 and M20. The nanowires 121d and 126d constitute the channel portion of the n-type transistor M30, and the pads 122d, 122e, 127d, and 127e constitute the nodes of the n-type transistor M30. The pads 122d and 127d are shared by the n-type transistors M20 and M30.

Gate interconnects 131a, 131b, 131c, and 131d extend in the X direction and also extend in the Z direction over the lower and upper parts of the memory cells. The gate interconnect 131a is to be the gate of the n-type transistor M00. That is, the n-type transistor M00 is constituted by the nanowires 121a and 126a, the gate interconnect 131a, and the pads 122a, 122b, 127a, and 127b. Likewise, the gate interconnect 131b is to be the gate of the n-type transistor M10, the gate interconnect 131c is to be the gate of the n-type transistor M20, and the gate interconnect 131d is to be the gate of the n-type transistor M30. The gate interconnects 131a, 131b, 131c, and 131d are connected to the word lines WL0, WL1, WL2, WL3, respectively.

In the lower part of the memory cells, local interconnects 141a, 141b, 141c, 141d, and 141e extending in the X direction are formed. The local interconnects 141a, 141b, 141c, 141d, and 141e are connected with the pads 122a, 122b, 122c, 122d, and 122e, respectively, and extend both leftward and rightward from the pads 122a, 122b, 122c, 122d, and 122e in the figure. In the upper part of the memory cells, local interconnects 143a, 143b, 143c, 143d, and 143e extending in the X direction are formed. The local interconnects 143a, 143b, 143c, 143d, and 143e are connected with the pads 127a, 127b, 127c, 127d, and 127e, respectively, and extend both leftward and rightward from the pads 127a, 127b, 127c, 127d, and 127e in the figure.

The local interconnects 141a and 143a are mutually connected through a contact 151a, the local interconnects 141b and 143b are mutually connected through a contact 151b, the local interconnects 141c and 143c are mutually connected through a contact 151c, the local interconnects 141d and 143d are mutually connected through a contact 151d, and the local interconnects 141e and 143e are mutually connected through a contact 151e.

The local interconnects 143a, 143d, and 143e are connected with the M1 interconnect 161 through contacts 152a, 152b, and 152c, respectively. The local interconnects 143b and 143c are connected with the M1 interconnect 162 through contacts 153a and 153b, respectively. That is, in the n-type transistors M00 and M20, one of the nodes is connected to the M1 interconnect 161, and the other node is connected to the M1 interconnect 162. In the n-type transistor M10, both nodes are connected to the M1 interconnect 162. In the n-type transistor M30, both nodes are connected to the M1 interconnect 161.

As described above, according to this embodiment, a ROM cell includes first and second transistors that are three-dimensional transistors constituting the n-type transistor M00, provided between the M1 interconnect 162 corresponding to the bit line BL0 and the M1 interconnect 161 that supplies VSS. The second transistor is formed above the first transistor, and the channel portions of the first and second transistors overlap each other as viewed in plan. The local interconnect 141a connected to the source of the first transistor and the local interconnect 143a connected to the source of the second transistor are mutually connected. The local interconnect 141b connected to the drain of the first transistor and the local interconnect 143b connected to the drain of the second transistor are mutually connected. Data is stored in the ROM cell depending on whether the paired local interconnects 141a and 143a and the paired local interconnects 141b and 143b are connected to a same line, or different lines, out of the M1 interconnect 162 and the M1 interconnect 161. In this way, a small-area layout structure of a mask ROM can be implemented.

In this embodiment, since a memory cell of one bit is formed by two transistors formed in the upper and lower parts, the drive capability is great, compared with the first embodiment, permitting high-speed operation. Also, if the transistor characteristics vary between the upper part and the lower part, characteristics may vary every bit line in the first embodiment. This embodiment however will not be affected by such variations. Moreover, since the memory value of the memory cell is set using a contact at an upper position compared with the case of the first embodiment, the manufacturing time for changing the memory value of the memory cell can be shortened. On the other hand, in the first embodiment, the area of the memory cell array can be reduced compared with this embodiment.

Also, since lines for supplying the power supply voltage VSS are provided between bit lines, crosstalk noise between bit lines can be reduced. This leads to stability of the operation.

Moreover, the positions of the contacts for connecting the upper and lower transistors constituting the memory cells are zigzagged. Therefore, since some distance can be secured between the adjacent contacts, the manufacturing easiness improves, the yield improves, and the reliability of the semiconductor storage device improves.

(Alteration)

FIGS. 7A-7B and 8A-8C are views showing an example of a layout structure of a mask ROM according to an alteration of the second embodiment, where FIGS. 7A-7B are plan views of memory cells, and FIGS. 8A-8C are cross-sectional views of the memory cells taken in the vertical direction as viewed in plan. Specifically, FIG. 7A shows an upper part and FIG. 7B shows a lower part. FIG. 8A shows a cross section taken along line Y1-Y1', FIG. 8B shows a cross section taken along line Y2-Y2', and FIG. 8C shows a cross section taken along line Y3-Y3'.

In FIGS. 7A-7B and 8A-8C, components in common with those in FIGS. 5A-5B and 6A-6C are denoted by the same reference characters, and the description thereof may be omitted here.

In this alteration, power supply lines 111 and 112 extending in the Y direction are provided on the left ends of the memory cells in the figure. The power supply lines 111 and 112 are both buried power rails (BPRs) formed in a buried interconnect layer, and supply the power supply voltage VSS.

The local interconnects 141a, 141d, and 141e are connected with the power supply line 111 through contacts 154a, 154b, and 154c, respectively. The local interconnects 143b and 143c are connected with the M1 interconnect 162 through the contacts 153a and 153b, respectively. That is, in the n-type transistors M00 and M20, one of the nodes is connected to the power supply line 111, and the other node is connected to the M1 interconnect 162. In the n-type transistor M10, both nodes are connected to the M1 interconnect 162. In the n-type transistor M30, both nodes are connected to the power supply line 111.

The M1 interconnects 161 and 163 are not connected with any memory cell, but function for reduction of crosstalk noise between bit lines.

In this alteration, similar effects to those in the above-described embodiment can be obtained. Also, since lines for supplying the power supply voltage VSS are provided between bit lines, crosstalk noise between bit lines can be reduced. This leads to stability of the operation.

While the power supply lines 111 and 112 for supply of VSS extend in the Y direction on the left ends of the memory cells in the figure, they may be provided to extend in the Y direction on the right ends of the memory cells in the figure. In this case, the positions of the contacts for connection to the power supply lines may also be on the right ends of the memory cells. It is also possible to provide the power supply lines for supply of VSS on both the left and right ends of the memory cells. In this case, the positions of the contacts for connection to the power supply lines may be on either left or right ends of the memory cells.

Third Embodiment

Figures 10A, 10B:
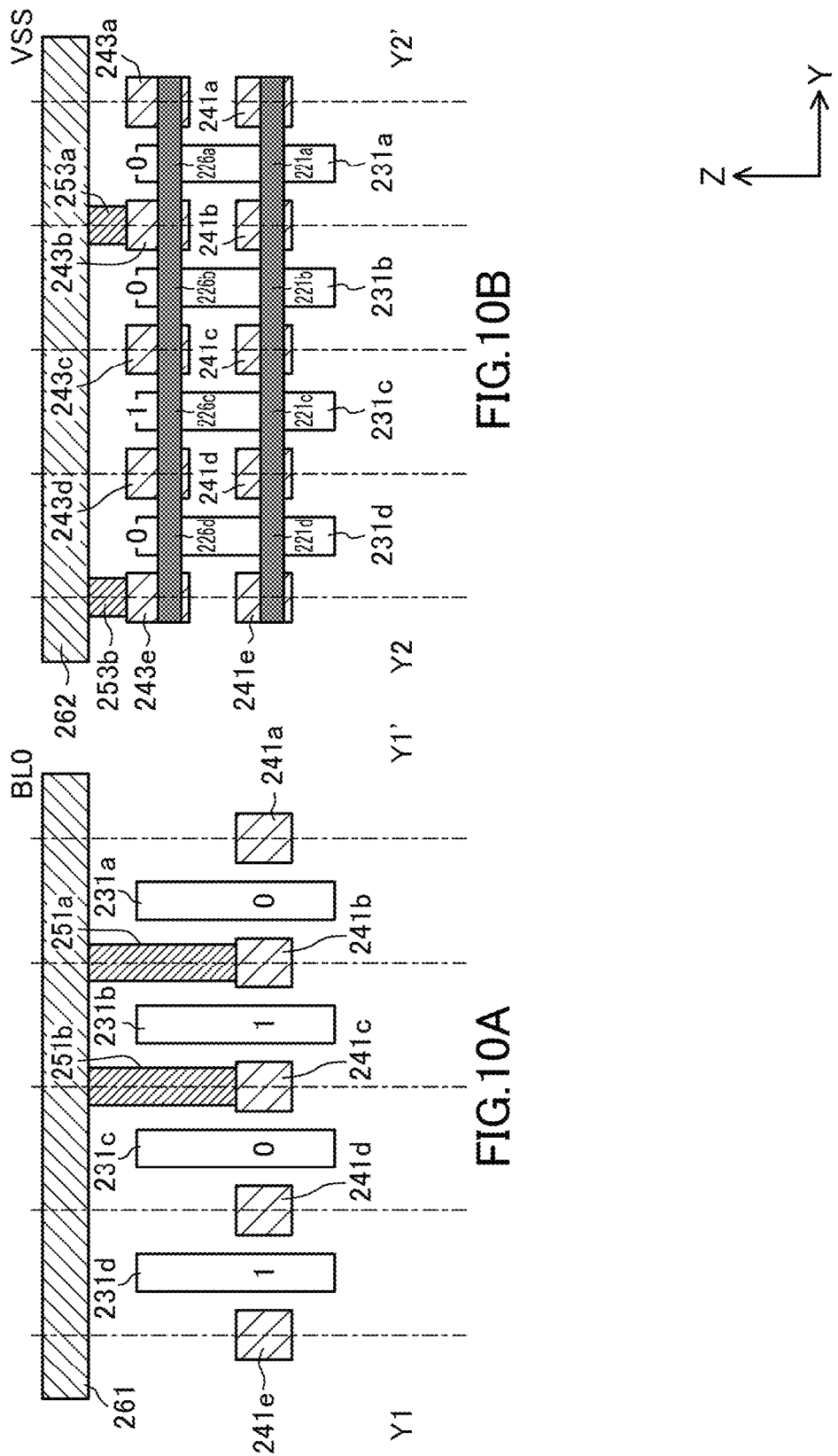
FIGS. 10A and 10B are cross-sectional views of the memory cells of FIGS. 9A-9B.

FIGS. 9A-9B and 10A-10B are views showing an example of a layout structure of a mask ROM according to the third embodiment, where FIGS. 9A-9B are plan views of memory cells, and FIGS. 10A-10B are cross-sectional views of the memory cells taken in the vertical direction as viewed in plan. Specifically, FIG. 9A shows an upper part and FIG. 9B shows a lower part. FIG. 10A shows a cross section taken along line Y1-Y1', and FIG. 10B shows a cross section taken along line Y2-Y2'.

FIGS. 9A-9B correspond to a layout of eight bits of memory cells, two arranged in the horizontal direction and four in the vertical direction, in the memory cell array 3 in FIG. 1. One bit of memory cell is constituted by two n-type transistors lying side by side in the X direction formed in the upper part shown in FIG. 9A. That is, the transistors shown in FIGS. 9A-9B correspond to eight n-type transistors Mij (i=0 to 3, j=0, 1) in the circuit diagram of FIG. 1, for example. The broken line defines the bounds of each memory cell.

As shown in FIG. 9A, interconnects 261, 262, 263, and 264 extending in the Y direction are formed in an M1 interconnect layer. The interconnect 261 corresponds to the bit line BL0, the interconnects 262 and 264 supply the power supply voltage VSS, and the interconnect 263 corresponds to the bit line BL1.

In the lower part of the memory cells, nanowires 221a, 221b, 221c, and 221d extending in the Y direction are formed. Also, nanowires 223a, 223b, 223c, and 223d extending in the Y direction are formed to lie side by side with the nanowires 221a, 221b, 221c, and 221d, respectively, in the X direction. In the upper part of the memory cells, nanowires 226a, 226b, 226c, and 226d extending in the Y direction are formed. Also, nanowires 228a, 228b, 228c, and 228d extending in the Y direction are formed to lie side by side with the nanowires 226a, 226b, 226c, and 226d, respectively, in the X direction. The nanowires 221a and 226a overlap each other as viewed in plan, the nanowires 221b and 226b overlap each other as viewed in plan, the nanowires 221c and 226c overlap each other as viewed in plan, and the nanowires 221d and 226d overlap each other as viewed in plan. Also, the nanowires 223a and 228a overlap each other as viewed in plan, the nanowires 223b and 228b overlap each other as viewed in plan, the nanowires 223c and 228c overlap each other as viewed in plan, and the nanowires 223d and 228d overlap each other as viewed in plan.

Pads 222a, 222b, 222c, 222d, and 222e doped with an n-type semiconductor are formed at the lower end of the nanowire 221a, between the nanowires 221a and 221b, between the nanowires 221b and 221c, between the nanowires 221c and 221d, and at the upper end of the nanowire 221d, respectively. Pads 224a, 224b, 224c, 224d, and 224e doped with an n-type semiconductor are formed at the lower end of the nanowire 223a, between the nanowires 223a and 223b, between the nanowires 223b and 223c, between the nanowires 223c and 223d, and at the upper end of the nanowire 223d, respectively.

Also, pads 227a, 227b, 227c, 227d, and 227e doped with an n-type semiconductor are formed at the lower end of the nanowire 226a, between the nanowires 226a and 226b, between the nanowires 226b and 226c, between the nanowires 226c and 226d, and at the upper end of the nanowire 226d, respectively. Pads 229a, 229b, 229c, 229d, and 229e doped with an n-type semiconductor are formed at the lower end of the nanowire 228a, between the nanowires 228a and 228b, between the nanowires 228b and 228c, between the nanowires 228c and 228d, and at the upper end of the nanowire 228d, respectively.

In the lower part of the memory cells, the nanowires 221a and 223a constitute the channel portion of the n-type transistor M00, and the pads 222a, 222b, 224a, and 224b constitute the nodes of the n-type transistor M00. The nanowires 221b and 223b constitute the channel portion of the n-type transistor M10, and the pads 222b, 222c, 224b, and 224c constitute the nodes of the n-type transistor M10. The pads 222b and 224b are shared by the n-type transistors M00 and M10. The nanowires 221c and 223c constitute the channel portion of the n-type transistor M20, and the pads 222c, 222d, 224c, and 224d constitute the nodes of the n-type transistor M20. The pads 222c and 224c are shared by the n-type transistors M10 and M20. The nanowires 221d and 223d constitute the channel portion of the n-type transistor M30, and the pads 222d, 222e, 224d, and 224e constitute the nodes of the n-type transistor M30. The pads 222d and 224d are shared by the n-type transistors M20 and M30.

In the upper part of the memory cells, the nanowires 226a and 228a constitute the channel portion of the n-type transistor M01, and the pads 227a, 227b, 229a, and 229b constitute the nodes of the n-type transistor M01. The nanowires 226b and 228b constitute the channel portion of the n-type transistor M11, and the pads 227b, 227c, 229b, and 229c constitute the nodes of the n-type transistor M11. The pads 227b and 229b are shared by the n-type transistors M01 and M11. The nanowires 226c and 228c constitute the channel portion of the n-type transistor M21, and the pads 227c, 227d, 229c, and 229d constitute the nodes of the n-type transistor M21. The pads 227c and 229c are shared by the n-type transistors M11 and M21. The nanowires 226d and 228d constitute the channel portion of the n-type transistor M31, and the pads 227d, 227e, 229d, and 229e constitute the nodes of the n-type transistor M31. The pads 227d and 229d are shared by the n-type transistors M21 and M31.

Gate interconnects 231a, 231b, 231c, and 231d extend in the X direction and also extend in the Z direction over the lower and upper parts of the memory cells. The gate interconnect 231a is to be the gates of the n-type transistors M00 and M01. That is, the n-type transistor M00 is constituted by the nanowires 221a and 223a, the gate interconnect 231a, and the pads 222a, 222b, 224a, and 224b. The n-type transistor M01 is constituted by the nanowires 226a and 228a, the gate interconnect 231a, and the pads 227a, 227b, 229a, and 229b. Likewise, the gate interconnect 231b is to be the gates of the n-type transistors M10 and M11, the gate interconnect 231c is to be the gates of the n-type transistors M20 and M21, and the gate interconnect 231d is to be the gates of the n-type transistors M30 and M31. The gate interconnects 231a, 231b, 231c, and 231d are connected to the word lines WL0, WL1, WL2, WL3, respectively.

In the lower part of the memory cells, local interconnects 241a, 241b, 241c, 241d, and 241e extending in the X direction are formed. The local interconnect 241a is connected with the pads 222a and 224a and extends leftward and rightward from the pads 222a and 224a in the figure. The local interconnect 241b is connected with the pads 222b and 224b and extends leftward and rightward from the pads 222b and 224b in the figure. The local interconnect 241c is connected with the pads 222c and 224c and extends leftward and rightward from the pads 222c and 224c in the figure. The local interconnect 241d is connected with the pads 222d and 224d and extends leftward and rightward from the pads 222d and 224d in the figure. The local interconnect 241e is connected with the pads 222e and 224e and extends leftward and rightward from the pads 222e and 224e in the figure.

In the upper part of the memory cells, local interconnects 243a, 243b, 243c, 243d, and 243e extending in the X direction are formed. The local interconnect 243a is connected with the pads 227a and 229a. The local interconnect 243b is connected with the pads 227b and 229b. The local interconnect 243c is connected with the pads 227c and 229c. The local interconnect 243d is connected with the pads 227d and 229d. The local interconnect 243e is connected with the pads 227e and 229e.

The local interconnects 241b and 241c are connected with the M1 interconnect 261 through contacts 251a and 251b, respectively. The local interconnects 241a, 241d, and 241c are connected with the M1 interconnect 264 through contacts 252a, 252b, and 252c, respectively. That is, in the n-type transistors M00 and M20, one of the nodes is connected to the M1 interconnect 261, and the other node is connected to the M1 interconnect 264. In the n-type transistor M10, both nodes are connected to the M1 interconnect 261. In the n-type transistor M30, both nodes are connected to the M1 interconnect 264.

The local interconnects 243b and 243e are connected with the M1 interconnect 262 through contacts 253a and 253b, respectively. The local interconnects 243a, 243c, and 243d are connected with the M1 interconnect 263 through contacts 254a, 254b, and 254c, respectively. That is, in the n-type transistors M01, M11, and M31, one of the nodes is connected to the M1 interconnect 262, and the other node is connected to the M1 interconnect 263. In the n-type transistor M21, both nodes are connected to the M1 interconnect 263.

As described above, according to this embodiment, a ROM cell includes the three-dimensional transistor M00 provided between the M1 interconnect 261 corresponding to the bit line BL0 and the M1 interconnect 264 that supplies VSS and the three-dimensional transistor M01 provided between the M1 interconnect 263 corresponding to the bit line BL1 and the M1 interconnect 262 that supplies VSS. The transistors M00 and M01 are each constituted by two parallel-connected transistors lying side by side in the X direction. The transistor M01 is formed above the transistor M00, and the channel portions of the transistors M00 and M01 overlap each other as viewed in plan. First data is stored in the ROM cell depending on whether the local interconnects 241a and 241b connected to the sources and drains of the transistor M00 are connected to a same line, or different lines, out of the M1 interconnect 261 and the M1 interconnect 264. Also, second data is stored in the ROM cell depending on whether the local interconnects 243a and 243b connected to the sources and drains of the transistor M01 are connected to a same line, or different lines, out of the M1 interconnect 263 and the M1 interconnect 262. In this way, a small-area layout structure of a mask ROM can be implemented.

Also, in this embodiment, since a memory cell of one bit is formed by two parallel-connected transistors lying side by side in the X direction, the drive capability is great, compared with the first embodiment, permitting high-speed operation. While the transistor constituting a memory cell includes two transistors connected in parallel in the above-described example, it may include three or more transistors connected in parallel.

(Alteration)

FIGS. 11A-11B and 12A-12D are views showing an example of a layout structure of a mask ROM according to an alteration of the third embodiment, where FIGS. 11A-11B are plan views of memory cells, and FIGS. 12A-12D are cross-sectional views of the memory cells taken in the vertical direction as viewed in plan. Specifically, FIG. 11A shows an upper part and FIG. 11B shows a lower part. FIG. 12A shows a cross section taken along line Y1-Y1', FIG. 12B shows a cross section taken along line Y2-Y2'. FIG. 12C shows a cross section taken along line Y3-Y3', and FIG. 12D shows a cross section taken along line Y4-Y4'.

In FIGS. 11A-11B and 12A-12D, components in common with those in FIGS. 9A-9B and 10A-10B are denoted by the same reference characters, and the description thereof may be omitted here.

In this alteration, as shown in FIG. 11B, power supply lines 211 and 212 extending in the Y direction are provided on both ends of the memory cells in the X direction. The power supply lines 211 and 212 are both buried power rails (BPRs) formed in the buried interconnect layer, and supply the power supply voltage VSS. The M1 interconnects 262 and 264 supplying the power supply voltage VSS are not connected with any memory cell, but function for reduction of crosstalk noise between bit lines.

In the lower part of the memory cells, local interconnects 245a, 245b, 245c, 245d, and 245e extending in the X direction are formed. The local interconnect 245a is connected with the pads 222a and 224a and extends leftward from the pads 222a and 224a in the figure. The local interconnect 245b is connected with the pads 222b and 224b and extends leftward from the pads 222b and 224b in the figure. The local interconnect 245c is connected with the pads 222c and 224c and extends leftward from the pads 222c and 224c in the figure. The local interconnect 245d is connected with the pads 222d and 224d and extends leftward from the pads 222d and 224d in the figure. The local interconnect 245e is connected with the pads 222e and 224e and extends leftward from the pads 222e and 224e in the figure.

In the upper part of the memory cells, local interconnects 247a, 247b, 247c, 247d, and 247e extending in the X direction are formed. The local interconnect 247a is connected with the pads 227a and 229a and extends rightward from the pads 227a and 229a in the figure. The local interconnect 247b is connected with the pads 227b and 229b and extends rightward from the pads 227b and 229b in the figure. The local interconnect 247c is connected with the pads 227c and 229c and extends rightward from the pads 227c and 229c in the figure. The local interconnect 247d is connected with the pads 227d and 229d and extends rightward from the pads 227d and 229d in the figure. The local interconnect 247e is connected with the pads 227e and 229e and extends rightward from the pads 227e and 229e in the figure.

The local interconnects 245a, 245b, 245c, 245d, and 245e overlap the power supply line 211 as viewed in plan, but do not overlap the power supply line 212. The local interconnects 247a, 247b, 247c, 247d, and 247e overlap the power supply line 212 as viewed in plan, but do not overlap the power supply line 211.

The local interconnects 245b and 245c are connected with the M1 interconnect 261 through the contacts 251a and 251b, respectively. The local interconnects 245a, 245d, and 245e are connected with the power supply line 211 through contacts 255a, 255b, and 255c, respectively. That is, in the n-type transistors M00 and M20, one of the nodes is connected to the M1 interconnect 261, and the other node is connected to the power supply line 211. In the n-type transistor M10, both nodes are connected to the M1 interconnect 261. In the n-type transistor M30, both nodes are connected to the power supply line 211.

The local interconnects 247b and 247e are connected with the power supply line 212 through contacts 256a and 256b, respectively. The local interconnects 247a, 247c, and 247d are connected with the M1 interconnect 263 through the contacts 254a, 254b, and 254c, respectively. That is, in the n-type transistors M01, M11, and M31, one of the nodes is connected to the power supply line 212, and the other node is connected to the M1 interconnect 263. In the n-type transistor M21, both nodes are connected to the M1 interconnect 263.

In this alteration, similar effects to those in the above-described embodiment can be obtained. Also, since lines for supplying the power supply voltage VSS are provided between bit lines, crosstalk noise between bit lines can be reduced. This leads to stability of the operation.

(Other Examples)

In the embodiments described above, while each transistor is assumed to have one nanowire, some or all transistors may have a plurality of nanowires. In this case, the plurality of nanowires may be arranged in the X direction as viewed in plan, or arranged in the Z direction. Alternatively, the plurality of nanowires may be arranged in both the X direction and the Z direction. The number of nanowires included in each transistor may be different between the upper and lower parts of the cell.

Also, while the cross-sectional shape of the nanowires is roughly square in the above embodiments, it is not limited to this. For example, the shape may be circular or rectangular.

While the above embodiments have been described taking nanowire FETs as an example of three-dimensional transistors, the transistor type is not limited to this. For example, a fin transistor may be used as the transistor formed in the lower part of the cell.

According to the present disclosure, a small-area layout structure can be implemented for a semiconductor integrated circuit device provided with ROM cells using CFETs. The present disclosure is therefore useful for improvement of the performance of a semiconductor chip, for example.

What is claimed is:

1. A semiconductor storage device provided with a read only memory (ROM) cell, comprising:
   a word line extending in a first direction parallel to a substrate plane;
   first and second bit lines extending in a second direction parallel to the substrate plane and perpendicular to the first direction; and
   a ground power supply line extending in the second direction, wherein:
   the ROM cell includes:
   a first nanowire field effect transistor (FET) provided between the first bit line and the ground power supply line, a second nanowire FET provided between the second bit line and the ground power supply line, formed above the first nanowire FET, nanowires as channel portions of the first and second nanowire FET extending in the second direction and overlapping each other as viewed in plan, a first local interconnect connected to a source of the first nanowire FET and connected to the first bit line or the ground power supply line, a second local interconnect connected to a drain of the first nanowire FET and connected to the first bit line or the ground power supply line, a third local interconnect connected to a source of the second nanowire FET and connected to the second bit line or the ground power supply line, and a fourth local interconnect connected to a drain of the second nanowire FET and connected to the second bit line or the ground power supply line, gates of the first and second nanowire FETs are connected to the word line, and first data is stored in the ROM cell depending on whether the first and second local interconnects are connected to a same line, or different lines, out of the first bit line and the ground power supply line, and second data is stored in the ROM cell depending on whether the third and fourth local interconnects are connected to a same line, or different lines, out of the second bit line and the ground power supply line; and
   wherein the first, second, third and fourth local interconnects extend in the first direction, the first and third local interconnects overlap each other as viewed in plan, and the second and fourth local interconnects overlap each other as viewed in plan.

2. The semiconductor storage device of claim 1, wherein the first and second local interconnects overlap the first bit line and the ground power supply line as viewed in plan, and the third and fourth local interconnects overlap the second bit line and the ground power supply line as viewed in plan.

3. The semiconductor storage device of claim 1, wherein the ROM cell includes a gate interconnect that extends in the first direction and also in a depth direction, is to be the gates of the first and second nanowire FETs, and is connected with the word line.

4. The semiconductor storage device of claim 1, wherein the first nanowire FET includes N (N is an integer equal to or greater than 2) transistors lying side by side in the first direction and sharing a source and a drain, and the second nanowire FET includes N transistors lying side by side in the first direction and sharing a source and a drain.

5. The semiconductor storage device of claim 1, wherein the ground power supply line is a buried power rail.

6. The semiconductor storage device of claim 1, wherein the ground power supply line is a line formed in a same layer as the first and second bit lines.

\* \* \* \* \*